(12) United States Patent
Lee et al.

(10) Patent No.: US 11,133,240 B2
(45) Date of Patent: Sep. 28, 2021

(54) SEMICONDUCTOR DEVICE AND SEMICONDUCTOR PACKAGE

(71) Applicant: Samsung Electronics Co., Ltd., Suwon-si (KR)

(72) Inventors: Hakseung Lee, Seoul (KR); Jinnam Kim, Anyang-si (KR); Kwangjin Moon, Hwaseong-si (KR); Eunji Kim, Seoul (KR); Taeseong Kim, Suwon-si (KR); Sangjun Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/794,782

(22) Filed: Feb. 19, 2020

(65) Prior Publication Data

US 2021/0020543 A1    Jan. 21, 2021

(30) Foreign Application Priority Data

Jul. 17, 2019    (KR) .......................... 10-2019-0086351

(51) Int. Cl.
*H01L 23/48* (2006.01)
*H01L 25/18* (2006.01)
(Continued)

(52) U.S. Cl.
CPC ...... *H01L 23/481* (2013.01); *H01L 21/76805* (2013.01); *H01L 21/76816* (2013.01);
(Continued)

(58) Field of Classification Search
CPC ......... H01L 21/76898; H01L 21/76805; H01L 24/17; H01L 21/76816; H01L 23/481; H01L 24/16; H01L 2224/17181; H01L 2224/16146; H01L 2224/16235; H01L 25/18

See application file for complete search history.

(56) References Cited

U.S. PATENT DOCUMENTS 6,448,177 B1    9/2002 Morrow et al.
6,479,391 B2    11/2002 Morrow et al.
(Continued)

FOREIGN PATENT DOCUMENTS

KR    1020090110568 A    10/2009

*Primary Examiner* — Herve-Louis Y Assouman
(74) *Attorney, Agent, or Firm* — Harness, Dickey & Pierce, P.L.C.

(57) ABSTRACT

A semiconductor device includes a semiconductor substrate including at least one semiconductor structure, an interlayer insulating layer disposed on the semiconductor substrate, at least one first via structure penetrating the semiconductor substrate and the interlayer insulating layer, including a first region having a first width at an upper surface of the interlayer insulating layer and a second region extending from the first region and having a second width at a lower surface of the semiconductor substrate, wherein a side surface of the first region and a side surface of the second region have different profiles at a boundary between the first region and the second region, and at least one second via structure penetrating the semiconductor substrate and the interlayer insulating layer and having a third width greater than the first width at an upper surface of the interlayer insulating layer.

20 Claims, 22 Drawing Sheets

(51) Int. Cl.
*H01L 21/768* (2006.01)
*H01L 25/065* (2006.01)
*H01L 23/00* (2006.01)

(52) U.S. Cl.
CPC ........ *H01L 21/76898* (2013.01); *H01L 24/16* (2013.01); *H01L 24/17* (2013.01); *H01L 25/18* (2013.01); *H01L 2224/16146* (2013.01); *H01L 2224/16235* (2013.01); *H01L 2224/17181* (2013.01)

(56) References Cited

U.S. PATENT DOCUMENTS

| | | |
|---|---|---|
| 6,787,469 B2 | 9/2004 | Houston et al. |
| 6,818,552 B2 | 11/2004 | Daniels et al. |
| 7,482,687 B2 | 1/2009 | Farrar |
| 9,666,476 B2 | 5/2017 | Hu et al. |
| 2010/0008058 A1* | 1/2010 | Saen ................ H01L 24/73 361/803 |
| 2011/0115047 A1 | 5/2011 | Hebert et al. |
| 2011/0156232 A1* | 6/2011 | Youn ................ H01L 23/481 257/686 |
| 2011/0207323 A1 | 8/2011 | Ditizio |
| 2013/0273742 A1 | 10/2013 | Yang et al. |
| 2017/0053872 A1* | 2/2017 | Lee ................ H01L 21/76898 |

* cited by examiner

'A'

SEMICONDUCTOR DEVICE AND SEMICONDUCTOR PACKAGE

CROSS-REFERENCE TO RELATED APPLICATION(S)

This application claims benefit of priority to Korean Patent Application No. 10-2019-0086351 filed on Jul. 17, 2019 in the Korean Intellectual Property Office, the disclosure of which is incorporated herein by reference in its entirety.

BACKGROUND

Example embodiments of the present inventive concepts relate to a semiconductor device and a semiconductor package.

A semiconductor device mounted on an electronic device may be packaged in various forms. Recently, a package in which semiconductor devices are stacked in a vertical direction has been suggested to potentially improve properties of a semiconductor device such as integration density, accessible bandwidth, power-consumption, and the like. In such a package, the semiconductor devices may include bumps for inputting and outputting a signal, and via structures connected to the bumps. The via structures may have various forms and sizes depending on the purposes of the via structures.

SUMMARY

Some example embodiments of the present inventive concepts are provided as relate to a semiconductor device including via structures having different shapes and/or sizes that may have improved reliability and yield by improving the processes for manufacturing the via structures, and/or a semiconductor package.

According to an example embodiment of the present inventive concepts, a semiconductor device includes a semiconductor substrate including at least one semiconductor structure, an interlayer insulating layer disposed on the semiconductor substrate, at least one first via structure penetrating the semiconductor substrate and the interlayer insulating layer, including a first region having a first width at an upper surface of the interlayer insulating layer and a second region extending from the first region and having a second width on a lower surface of the semiconductor substrate, wherein a side surface of the first region and a side surface of the second region have different profiles in a region adjacent to a boundary between the first region and the second region, and at least one second via structure penetrating the semiconductor substrate and the interlayer insulating layer and having a third width greater than the first width on an upper surface of the interlayer insulating layer.

According to an example embodiment of the present inventive concepts, a semiconductor package includes a first semiconductor device, and a second semiconductor device stacked with the first semiconductor device, the first semiconductor device includes at least one first via structure and at least one second via structure penetrating the first semiconductor device, and the at least one first via structure includes a first region having a first width on an upper surface of the semiconductor device and a second region having a second width on a lower surface of the first semiconductor device, and a width of a boundary surface between the first region and the second region is less than the first width.

According to an example embodiment of the present inventive concept, a semiconductor package includes a package substrate, a plurality of memory dies mounted on the package substrate, including memory cells configured to store data, the plurality of memory dies may be stacked in a direction perpendicular to an upper surface of the package substrate, a first via structure penetrating the plurality of memory dies and providing a transfer path of a data signal, and a second via structure penetrating the plurality of memory dies and providing a transfer path of a power signal, a difference between a maximum value and a minimum value of a width of the first via structure is less than a difference between a maximum value and a minimum value of a width of the second via structure, and a minimum value of a width of the first via structure is less than a minimum value of a width of the second via structure.

According to an example embodiment of the present inventive concepts, a method of manufacturing a semiconductor device includes forming a plurality of semiconductor structures on a semiconductor substrate, forming an interlayer insulating layer on an upper surface of the semiconductor substrate, forming a first trench having a first width and exposing the semiconductor substrate by partially removing the interlayer insulating layer in a first position, forming a second trench having a width greater than the first width and exposing the semiconductor substrate by partially removing the interlayer insulating layer in a second position different from the first position, extending the first trench and the second trench by etching the semiconductor substrate in the first trench and the second trench, and filling the first trench and the second trench with a conductive material.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Spatially relative terms, such as "lower," "vertical," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" would then be oriented as "upper," or if the device is rotated 90 degrees, "vertically stacked" elements would then be oriented as "horizontally stacked." In addition, when an element is referred to as being "between" two elements, the element may be the only element between the two elements, or one or more other intervening elements may be present.

Hereinafter, embodiments of the present inventive concepts will be described as follows with reference to the accompanying drawings.

Figure 1:
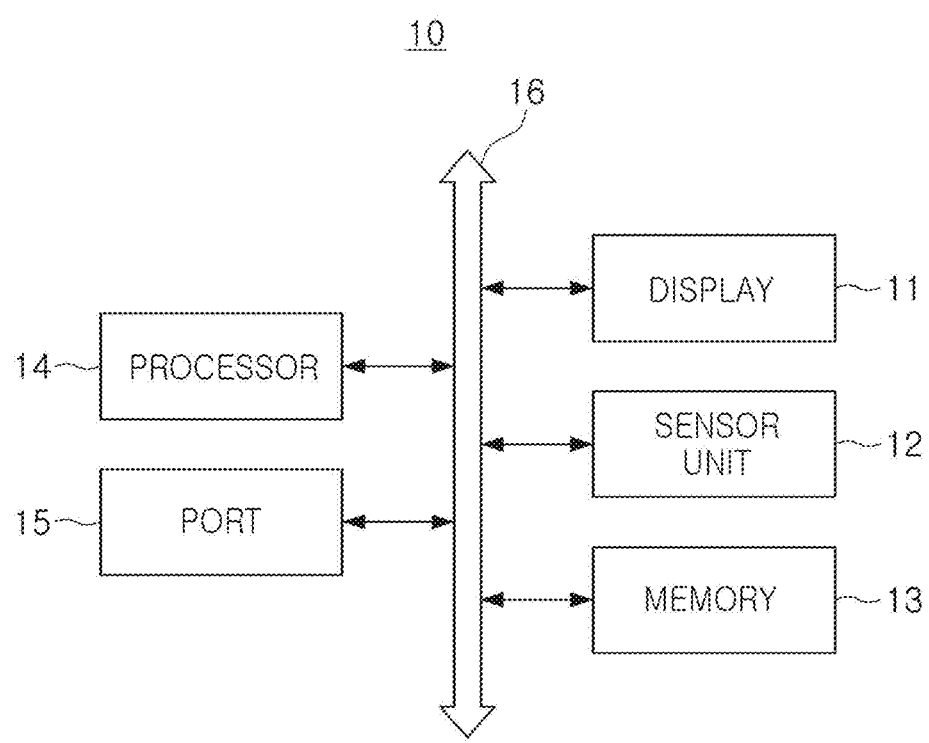
FIG. 1 is a block diagram illustrating an electronic device including a semiconductor device according to an example embodiment of the present inventive concepts.

FIG. 1 is a block diagram illustrating an electronic device including a semiconductor device according to an example embodiment.

An electronic device 10 in the example embodiment illustrated in FIG. 1 may include a display 11, a sensor unit 12, a memory 13, a processor 14, and a port 15. The electronic device 10 may further include a wired and wireless communication device, and a power device. Among the elements illustrated in FIG. 1, the port 15 may allow the electronic device 10 to communicate with other electrical components like a video card, a sound card, a memory card, a USB device, etc. The electronic device 10 may include a general desktop computer or a general laptop computer, a smartphone, a tablet PC, a smart wearable device, and the like.

The processor 14 may perform calculations; execute a command word; manage a task; and the like. The processor 14 may be implemented as a central processing unit (CPU), a microprocessor unit (MCU), a system-on-chip (SoC), an application processor (AP), or the like, and may include two or more cores performing a calculation, a command word, or the like. The processor 14 may communicate with the display 11, the sensor unit 12, the memory 13, and other devices connected to the port 15 through a bus 16.

The memory 13 may be implemented as a storage medium storing data required for an operation of the electronic device 10, multimedia data, and the like. The memory 13 may include a volatile memory such as a random access memory (RAM), or a non-volatile memory such as a flash memory, and the like. The memory 1030 may include at least one of a solid state drive (SSD), a hard disk drive (HDD), and an optical drive (ODD). The sensor unit 12 may include a GPS sensor, an imaging device, an optical sensor, a motion sensor, and the like.

At least one of the elements 11 to 15 included in the electronic device 10 may include a semiconductor package in which two or more semiconductor devices are stacked in a vertical direction. For example, an image device included in the sensor unit 12 may include an image sensor, a memory, and others, stacked in a vertical direction. In another example, memory dies for storing data may be vertically stacked in the memory 13.

In the semiconductor package in which semiconductor devices are stacked in a vertical direction, at least one of the semiconductor devices may include via structures for transmitting and receiving a signal. For example, the via structures may be implemented as through silicon vias (TSV). In an example embodiment, at least portions of the via structures included in a single semiconductor device may be configured to have different shapes and sizes, thereby improving integration density of the via structures.

Figure 2:
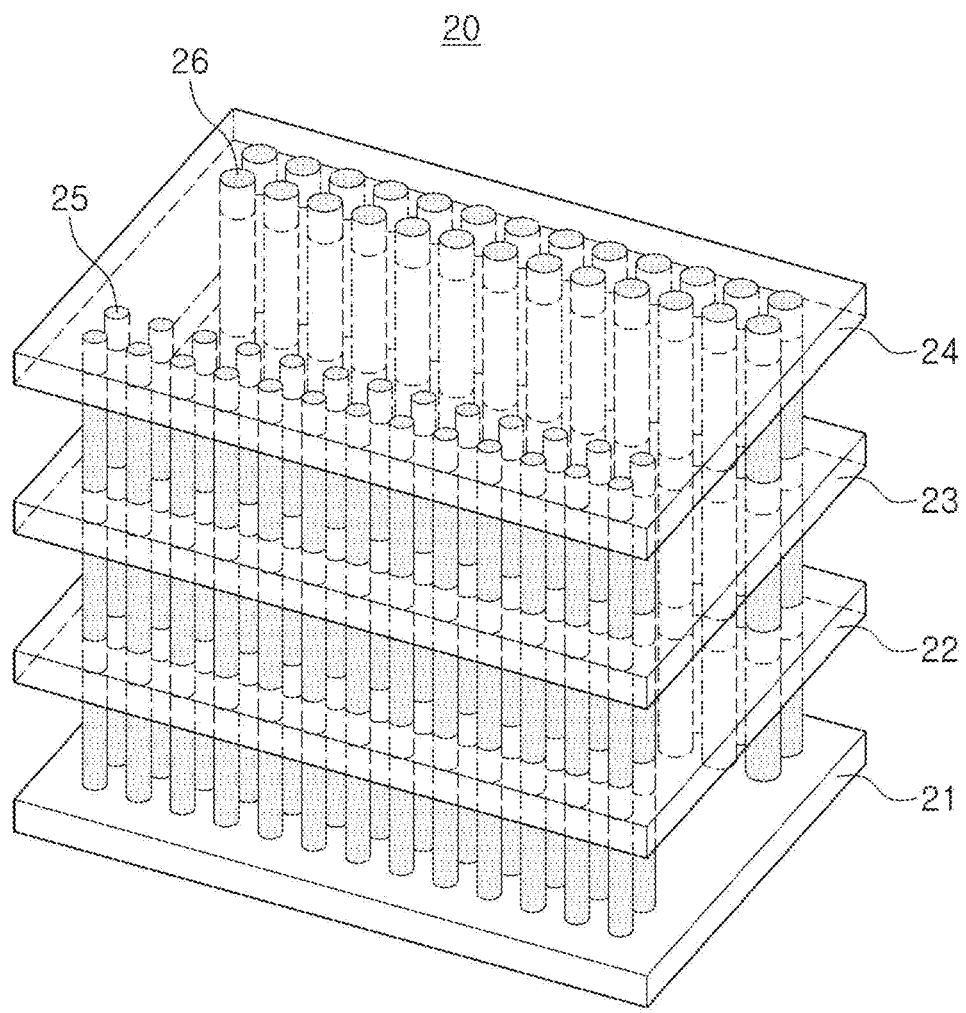
FIG. 2 is a perspective diagram illustrating a semiconductor device according to an example embodiment of the present inventive concepts.

FIG. 2 is a perspective diagram illustrating a semiconductor device according to an example embodiment.

Referring to FIG. 2, a semiconductor package 20 in the example embodiment may include a plurality of semiconductor devices 21 to 24 stacked in a vertical direction. For example, each of the plurality of semiconductor devices 21 to 24 may be implemented as a memory device for storing data, or may be implemented as an image sensor generating image data in response to external light. At least portions of the plurality of semiconductor devices 21 to 24 may perform different functions. For example, the second to fourth semiconductor devices 22 to 24 may include back regions having memory cells for storing data, and the first semiconductor device 21 may include logic circuits controlling the bank regions included in the second to fourth semiconductor devices 22 to 24.

The plurality of semiconductor devices 21 to 24 may transmit and receive data through a plurality of via structures 25 and 26. The plurality of via structures 25 and 26 may be TSV penetrating the plurality of semiconductor devices 21 to 24, and may include first via structures 25 and second via structures 26 having different sizes. For example, a width of each of the first via structures 25 may be less than a width of each of the second via structures 26. The number and an arrangement form of the first via structures 25 and the second via structures 26 may vary in example embodiments.

Each of the first via structures 25 in the example embodiment illustrated in FIG. 2 may have a width relatively smaller than a width of each of the second via structures. The width may be defined as a length of each of the via structures taken in a direction parallel to an upper surface of each of the plurality of semiconductor devices 21 to 24. The first via structures 25 may also provide different functions from the second via structures 26. For example, the first via structures 25 may provide transfer path for data signals, and the second via structures 26 may provide transfer paths for power signals.

The first via structures 25 and the second via structures 26 having different widths may be formed in the same process. In other words, the first via structures 25 and the second via structures 26 may be formed by forming a plurality of trenches having different widths, for example, by applying an etching process to each of the plurality of semiconductor devices 21 to 24, and filling the trenches with a conductive material. The trenches corresponding to the first via structures 25 and the trenches corresponding to the second via structures 26 may have different widths, and accordingly, there may be a difference between etching speeds, such that a length of each of the first via structures 25 may be different from a length of each of the second via structures 26.

When the first via structures 25 and the second via structures 26 are formed, a grinding process may be performed on each of the semiconductor devices 21 to 24, thereby exposing the first via structures 25 and the second via structures 26. When a length of each of the first via structures 25 is different from a length of each of the second via structures 26, the first via structures 25 and the second via structures 26 may receive different stresses produced by performing the grinding process. For example, each of the first via structures 25 may have a length longer than a length of each of the second via structures 26, and the first via structures 25 may be exposed earlier than the second via structures 26 by the grinding process. Thus, as the grinding process is continued until the second via structures 26 are exposed, the first via structures 25 may be bent or broken.

In the example embodiment, the first via structures 25 may have different widths on an upper surface and a lower surface of each of the semiconductor devices 21 to 24. For example, when the grinding process is performed on a lower surface of each of the semiconductor devices 21 to 24, a width of each of the first via structures 25 on an upper surface of each of the semiconductor devices 21 to 24 may be less than a width of each of the first via structures 25 on a lower surface of each of the semiconductor devices 21 to 24. Thus, by significantly reducing a difference in length between the first via structures 25 and the second via structures 26 and reducing stress applied to the via structures 25 and 26 in the grinding process, reliability of the via structures 25 and 26 may improve.

Figure 3:
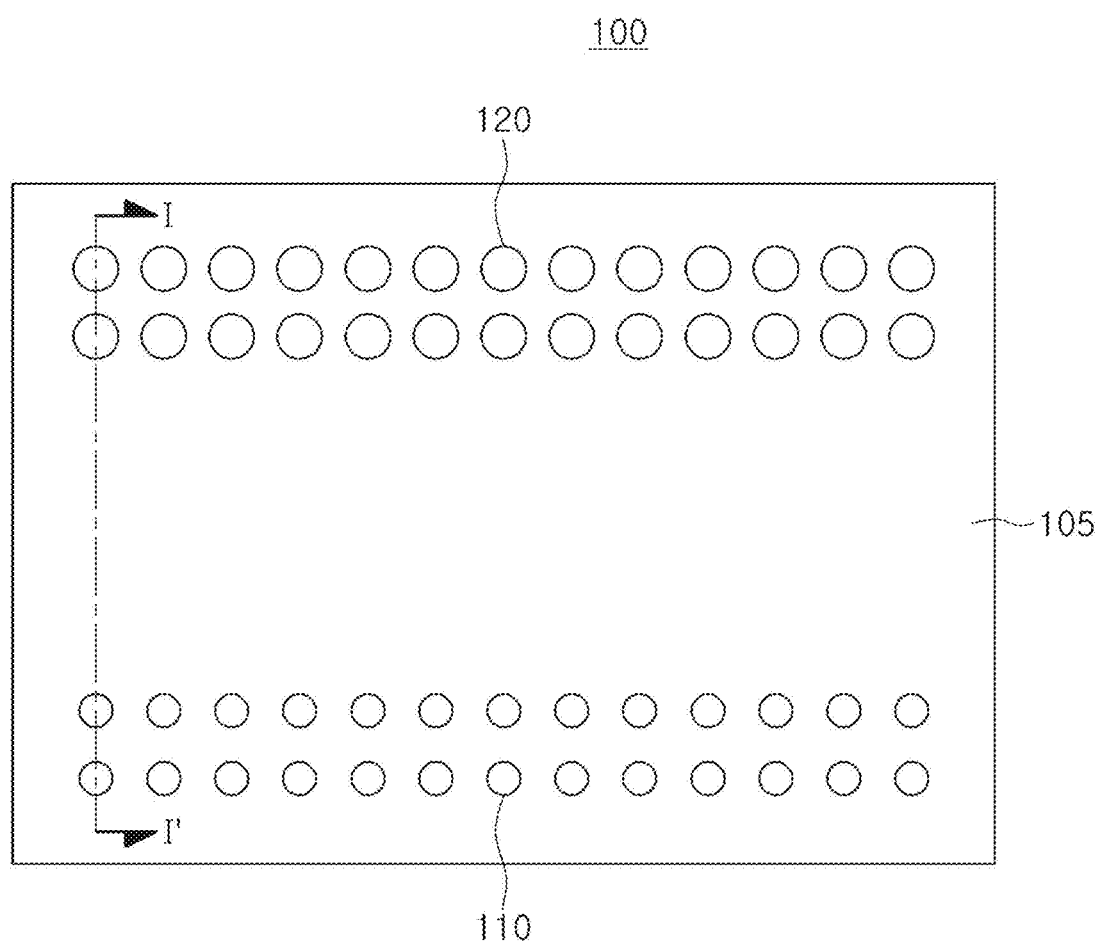
FIG. 3 is a diagram illustrating a semiconductor device according to an example embodiment of the present inventive concepts.
Figure 4:
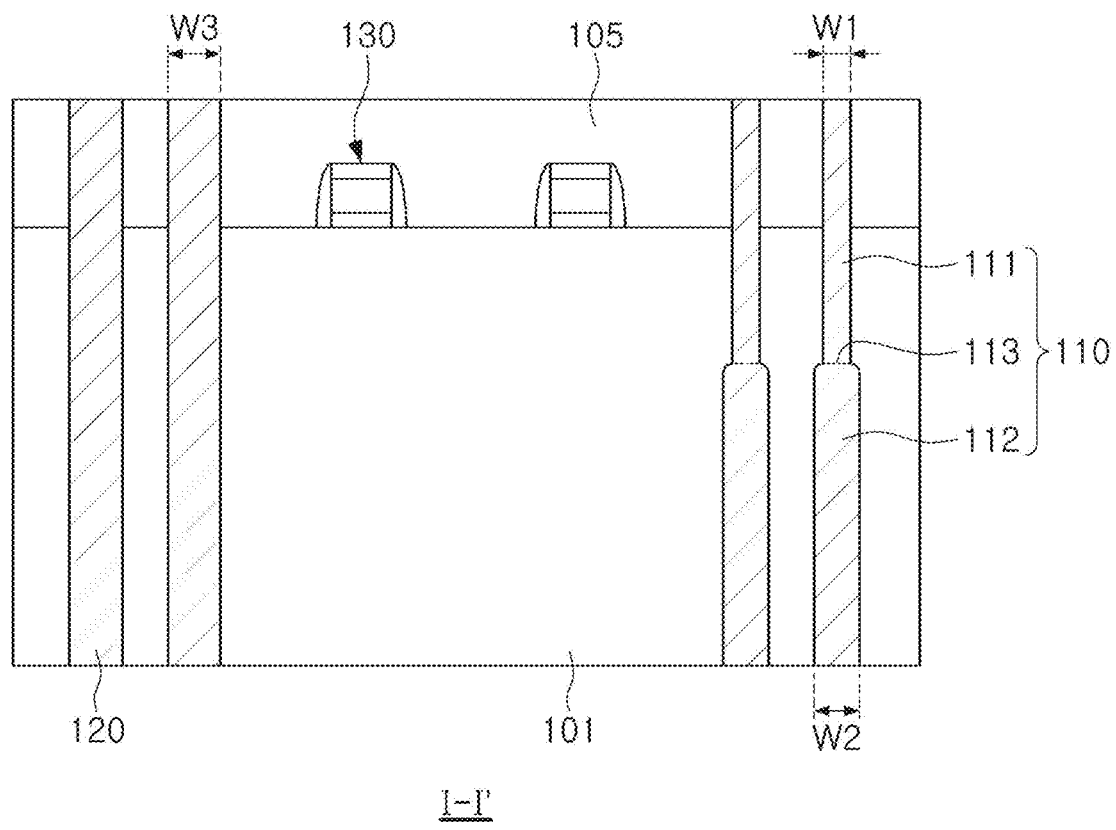
FIG. 4 is a cross-sectional diagram illustrating the semiconductor device illustrated in FIG. 3 taken along line I-I' in FIG. 3.

FIG. 3 is a diagram illustrating a semiconductor device according to an example embodiment. FIG. 4 is a cross-sectional diagram illustrating the semiconductor device illustrated in FIG. 3 taken along line I-I' in FIG. 3.

Referring to FIGS. 3 and 4, a semiconductor device 100 in the example embodiment may include a semiconductor substrate 101, an interlayer insulating layer 105, a first via structure 110, a second via structure 120, and a plurality of semiconductor structures 130. The plurality of semiconductor structures 130 may be covered by the interlayer insulating layer 105, and the interlayer insulating layer 105 may include an insulating material such as a silicon oxide, or the like.

FIG. 3 may be a diagram illustrating a plane of the semiconductor device 100 viewed from an upper surface of the semiconductor device 100. Referring to FIG. 3, the first via structure 110 may be separated from the second via structure 120. In other words, the first via structure 110 may be in a first area of the semiconductor device 100, and the second via structure 120 may be in a second area of the semiconductor device 100 different from the first area of the semiconductor device 100. Alternatively, differently from the example illustrated in FIG. 3, the first via structure 110 and the second via structure 120 may be adjacent to each other in other example embodiments.

Referring to FIG. 4, the first via structure 110 and the second via structure 120 may penetrate the semiconductor device 100. For example, the first via structure 110 and the second via structure 120 may be TSVs. The first via structure 110 and the second via structure 120 may extend from an upper surface of the interlayer insulating layer 105 to a lower surface of the semiconductor substrate 101. In other words, the first via structure 110 and the second via structure 120 may be exposed externally from an upper surface of the interlayer insulating layer 105 and from a lower surface of the semiconductor substrate 101.

Referring to FIG. 4, the first via structure 110 may include a first region 111 and a second region 112. The first region 111 may be configured to extend from an upper surface of the interlayer insulating layer 105, and the second region 112 may be configured to extend from a lower surface of the semiconductor substrate 101. A boundary surface 113 may be defined between the first region 111 and the second region 112. The boundary surface may be include as part of a boundary, the boundary being an area between the first region 111 and the second region 112. A length of each of the first region 111 and the second region 112 may be varied in example embodiments. For example, the first region 111 may be longer than the second via structure 120, or a length of the first region 111 may be the same as a length of the second region 112. A length of the second region 112 may also be longer than a length of the first region 111 as another example. The boundary surface 113 may be in the semiconductor substrate 101, and may be closer to an upper surface of the semiconductor substrate 101 than a lower surface of the semiconductor substrate 101.

The first region 111 may have a first width W1 on an upper surface of the interlayer insulating layer 105, and the second region 112 may have a second width W2 on a lower surface of the semiconductor substrate 101. The second width W2 may be greater than the first width W1. A width of the first region 111 may be less than a width of the second region 112, and as illustrated in FIG. 4, the first via structure 110 may have a curved side surface on the boundary surface 113. Accordingly, a side surface of the first region 111 and a side surface of the second region 112 may have different profiles on a region adjacent to the boundary surface 113.

The second via structure 120 may have a third width W3 on an upper surface of the interlayer insulating layer 105, and in one example embodiment may not be divided into a plurality of regions different from the first via structure 110. The third width W3 may be greater than the first width W1. In other words, the second via structure 120 may have a width greater than a width of the first region 111. The third width W3 may be greater than the second width W2, may be the same as the second width W2, or may be less than the second width W2.

Profiles of the first via structure 110 and the second via structure 120 may be different from the examples illustrated in FIG. 4. For example, the second via structure 120 may have the third width W3 on an upper surface of the interlayer insulating layer 105, and may have a profile in which a width of the second via structure 120 decreases towards a lower surface of the semiconductor substrate 101. The first region 111 of the first via structure 110 may have a width decreasing towards the boundary surface 113 from an upper surface of the interlayer insulating layer 105. The second region 112 of the first via structure 110 may have a width increasing from a region adjacent to the boundary surface 113, and the width may decrease towards a lower surface of the semiconductor substrate 101. The first region 111 and the second region 112 of the first via structure 110, and the second via structure 120 may have a tapered shape of which a width decreases in a length direction. Accordingly, a minimum value of a width of the semiconductor substrate 101 and a minimum value of a width of the second via structure 120 may appear at different positions in a length direction.

FIGS. 5 to 10 are enlarged diagrams illustrating a partial region of a semiconductor device according to an example embodiment.

FIGS. 5 to 10 are enlarged diagrams illustrating a first via structure 110, 110A, 110B, 110C, 110D, and 110E and a second via structure 120 included in each of semiconductor devices 100, 100A, 100B, 100C, 100D, and 100E. In the example embodiments illustrated in FIGS. 5 to 10, each of the semiconductor devices 100, 100A, 100B, 100C, 100D, and 100E may include a semiconductor substrate 101 and an interlayer insulating layer 105 covering the semiconductor substrate 101. The first via structure 110, 110A, 110B, 110C, 110D, and 110E and the second via structure 120 may be TSVs penetrating the semiconductor substrate 101 and the interlayer insulating layer 105.

Figure 5:
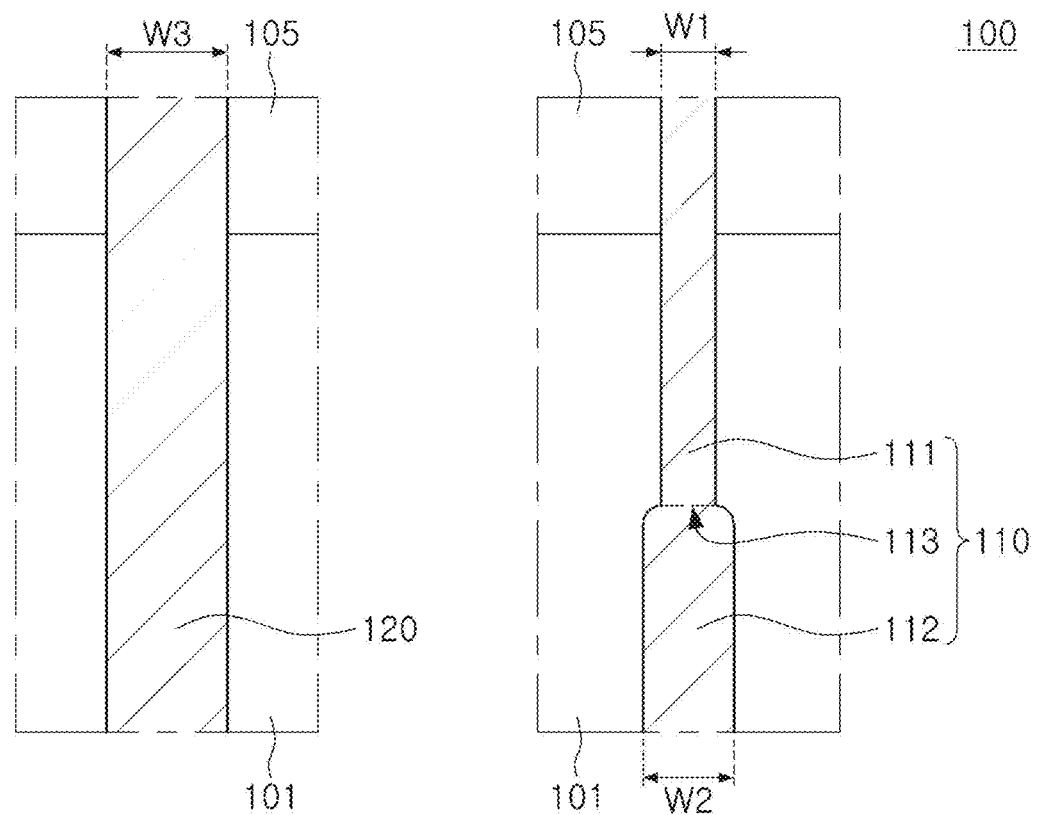
FIGS. 5 to 10 are enlarged diagrams illustrating a partial region of a semiconductor device according to an example embodiment of the present inventive concepts.

Referring to FIG. 5, the first via structure 110 may include a first region 111 and a second region 112, and a boundary surface 113. The boundary surface 113 may be defined as the intersectional space between the first region 111 and the second region 112. The first region 111 may have a first width W1, and the second region 112 may have a second width W2 greater than the first width W1. The second via structure 120 may have a third width W3, and the third width W3 may be greater than the first width W1 and the second width W2.

In a region adjacent to the boundary surface 113, the second region 112 may have a width increasing from the boundary surface 113. Alternatively, in a region adjacent to the boundary surface 113, the first region 111 may have a constant width without a substantial change, or may have a width decreasing towards the boundary surface 113. Accordingly, in a region adjacent to the boundary surface 113, the first region 111 and the second region 112 may have different profiles.

The first via structure 110 may have a first maximum width in the second region 112 and a minimum width in the first region 111. The second via structure 120 may also have a maximum and minimum width. The difference between the maximum and minimum widths of the first via structure 110 may be less than the difference between the maximum and minimum widths of the second via structure 120. In an example embodiment, the minimum width of the second via structure 120 may be at a different position from the minimum width of the first via structure when measured from a direction perpendicular to the upper surface of the interlayer insulating layer 105.

Figure 6:
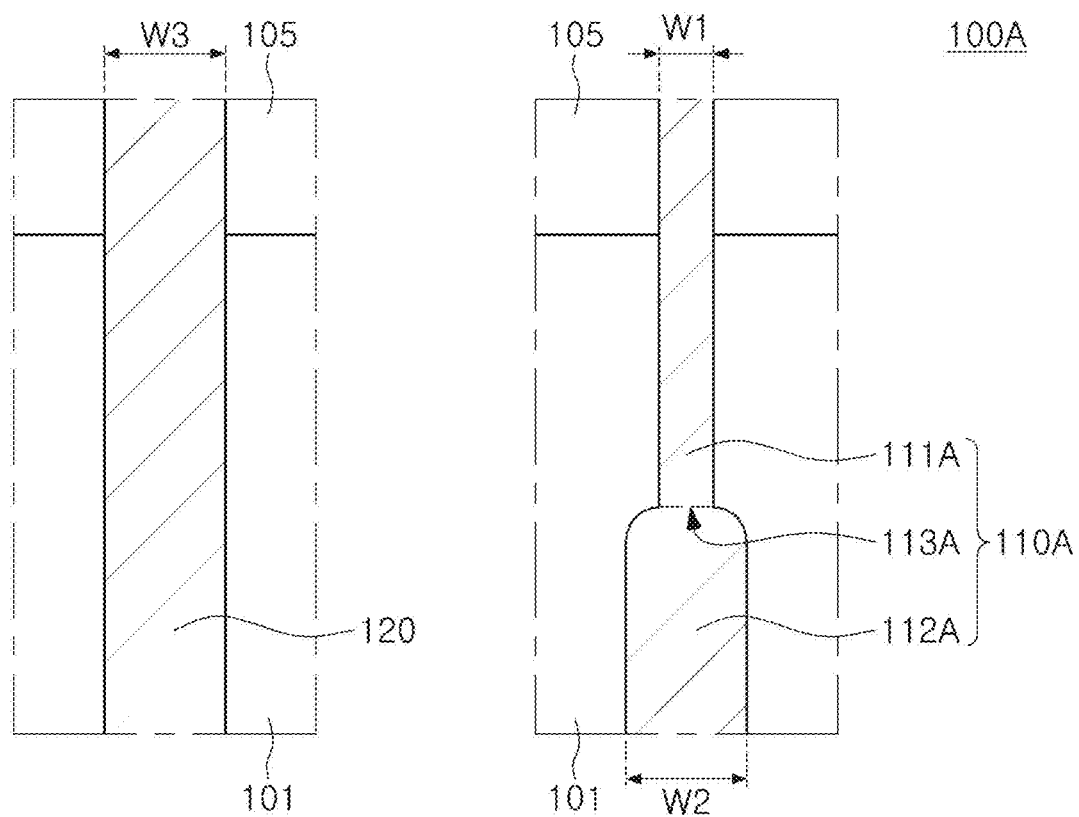

Referring to FIG. 6, the first via structure 110A may include the first region 111A and the second region 112A, and a boundary surface 113A may be defined between the first region 111A and the second region 112A. As in the example embodiment illustrated in FIG. 5, the first region 111A may have a first width W1 and the second region 112A may have a second width W2 greater than the first width W1. The second via structure 120 may have a third width W3 greater than the first width W1. In the example embodiment illustrated in FIG. 6, the third width W3 may be substantially the same as the second width W2. Also, in the example embodiment illustrated in FIG. 6, the first region 111A and the second region 112A may have different profiles in a region adjacent to the boundary surface 113.

Figure 7:
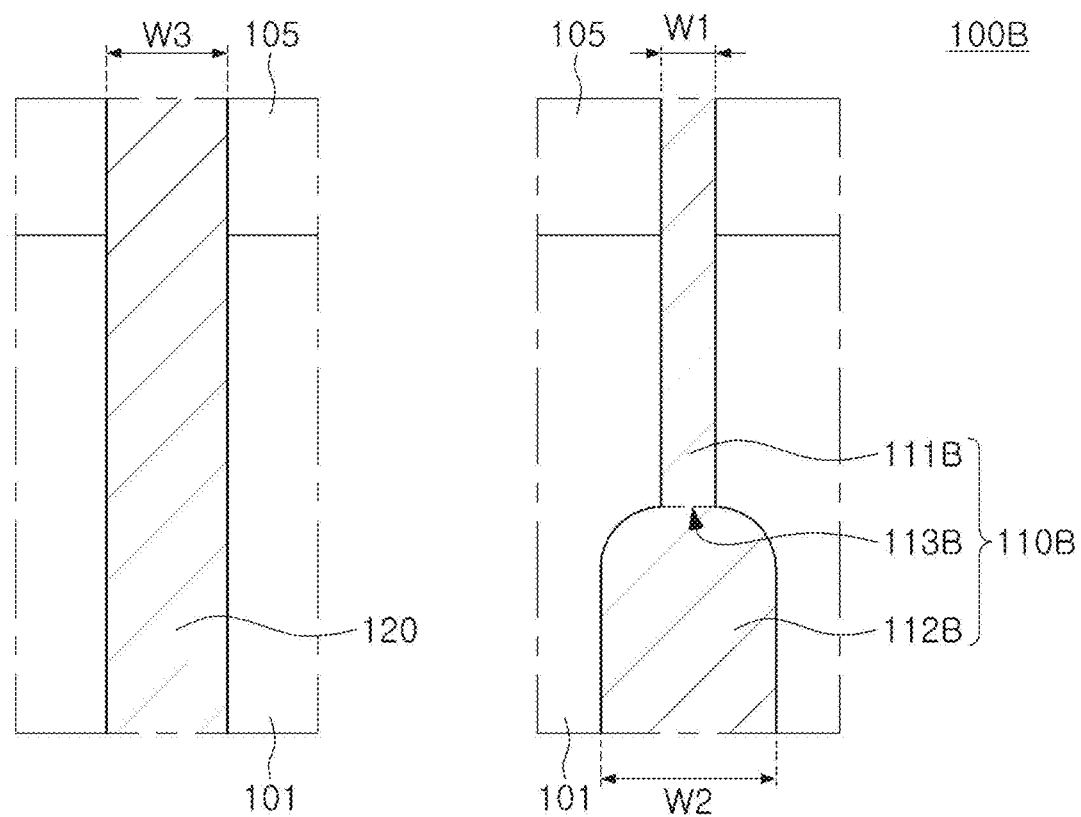

Referring to FIG. 7, the first via structure 110B may include the first region 111B and the second region 112B, and a boundary surface 113B may be defined between the first region 111B and the second region 112B. As in the example embodiment illustrated in FIG. 7, the first region 111B may have a first width W1, and the second region 112B may have a second width W2 greater than the first width W1. The second via structure 120 may have a third width W3 greater than the first width W1 and less than the second width W2. In the example embodiment illustrated in FIG. 7, the first region 111B and the second region 112B may have different profiles in a region adjacent to the boundary surface 113B.

Figure 8:
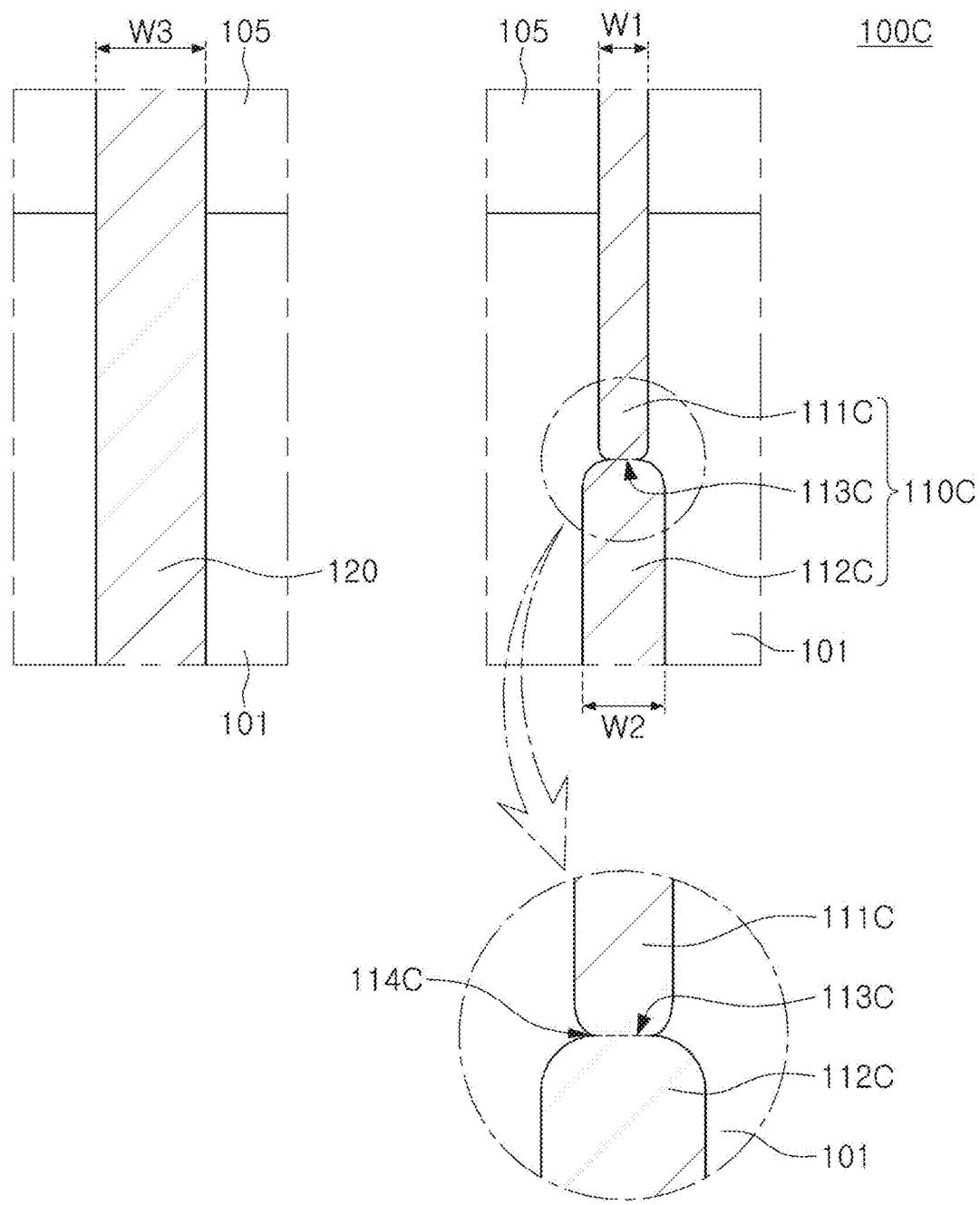

Referring to FIG. 8, the semiconductor device 100C may include a first via structure 110C and a second via structure 120. In the example embodiment illustrated in FIG. 8, a third width W3 of the second via structure 120 may be greater than the first width W1 of a first region 111C. The first region 111C may include a region having a width decreasing towards a boundary surface 113C in a region adjacent to the boundary surface 113C between the first region 111C and a second region 112C.

Accordingly, as illustrated in FIG. 8, a recess portion 114C may be formed at the boundary surface 113C or in a region adjacent to the boundary surface 113C. In the region in which the recess portion 114C is formed, a width of the first via structure 110C may have a minimum value. As an example, when the recess portion 114C is formed in the boundary surface 113C, a width of the boundary surface 113C may be determined as a minimum value of a width of the first via structure 110C.

Figure 9:
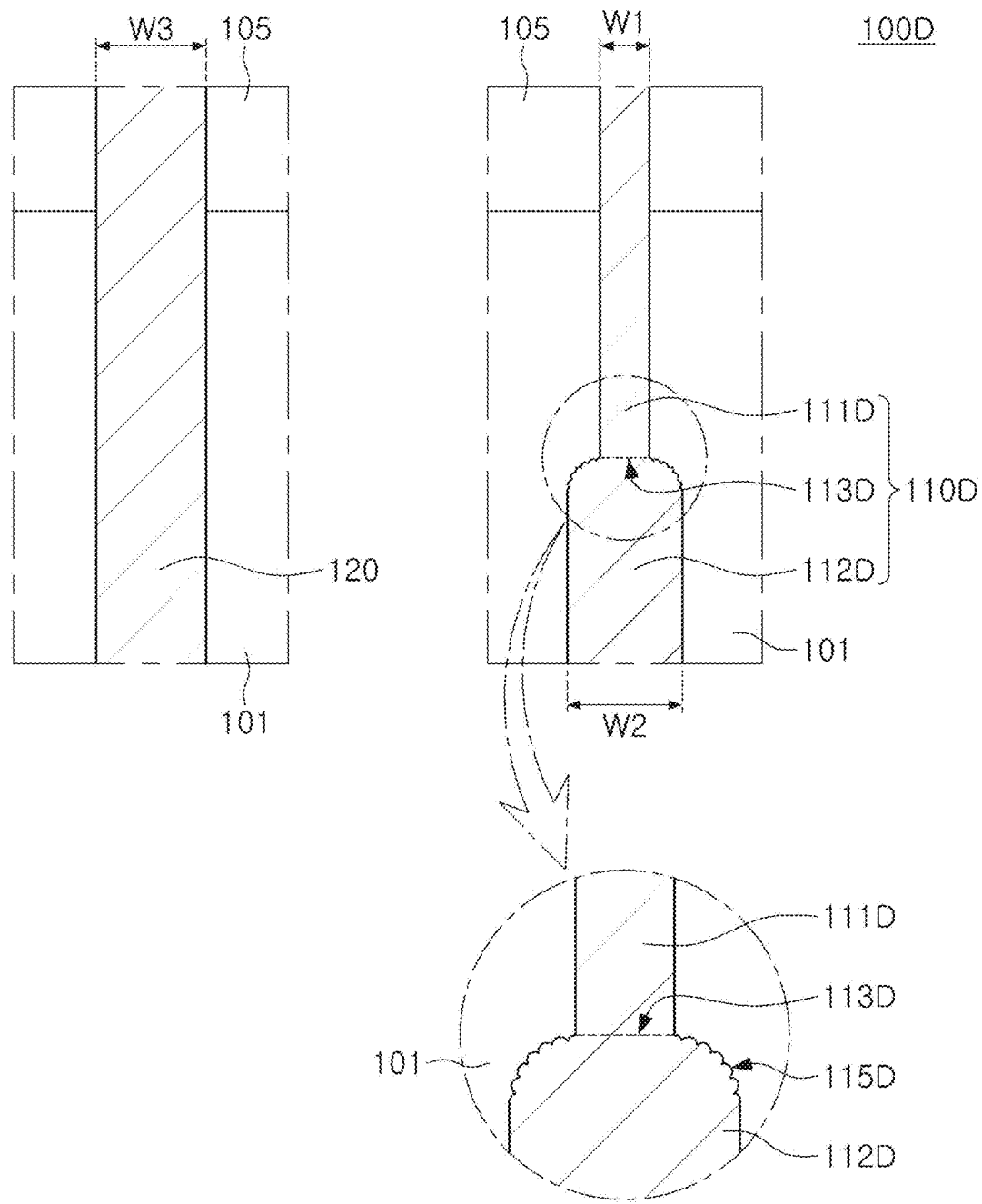

Referring to FIG. 9, the semiconductor device 100D may include the first via structure 110D and the second via structure 120. The first via structure 110D may include a first region 111D and a second region 112D, and a boundary surface 113D may be defined between the first region 111D and the second region 112D. In the example embodiment illustrated in FIG. 9, side surfaces of the second region 112D may have textures in a region adjacent to the boundary surface 113D. As an example, in a region adjacent to the boundary surface 113D, a plurality of embossed structures 115D may be formed on the side surfaces of the second region 112D. The plurality of embossed structures 115D may add additional curves (e.g., surface area) to the second region 112D.

The embossed structures 115D may be in a partial region of the second region 112D of which a width may increase from the boundary surface 113D. Alternatively, in other example embodiments, the embossed structures 115D may be formed across a greater area of the side surfaces of the second region 112D than the example illustrated in FIG. 9.

Figure 10:
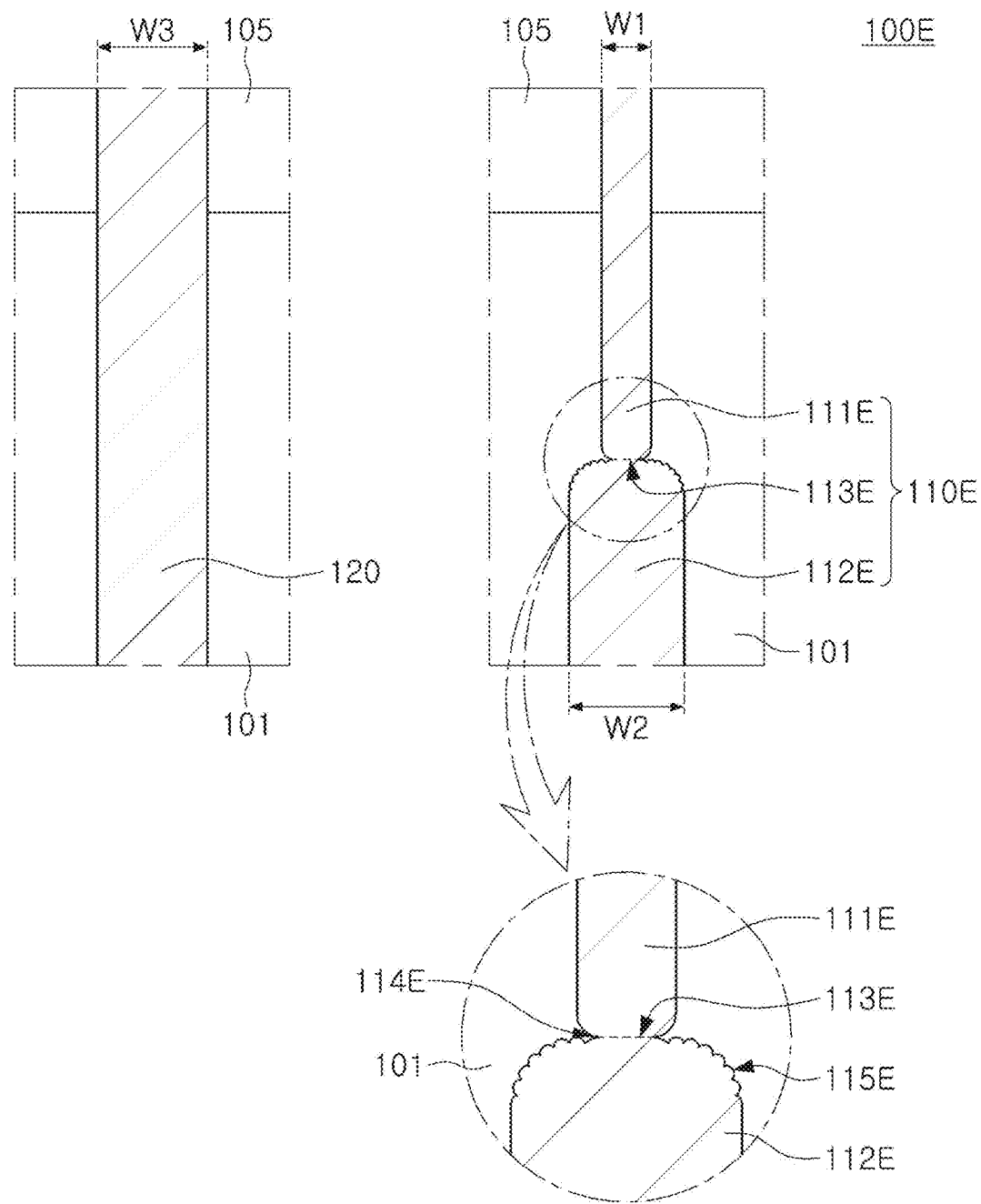

Referring to FIG. 10, the semiconductor device may include the first via structure 110E and the second via structure 120. The first via structure 110E may include a first region 111E and a second region 112E, and a boundary surface 113E may be defined between the first region 111E and the second region 112E. In the example embodiment illustrated in FIG. 10, the first via structure 110E may include a recess portion 114E formed at the boundary surface 113E or in a region adjacent to the boundary surface 113E. The second region 112E of the first via structure 110E may include a plurality of embossed structures 115E forming curvatures on side surfaces of the second region 112E.

The descriptions of the recess portion 114E and the embossed structures 115E may be understood from the aforementioned example embodiments described with reference to FIGS. 8 and 9. For example, a width of the first via structure 110E may have a minimum value in a region in which the recess portion 114E is formed. Also, the embossed structures 115E may be formed on the side surfaces of the second region 112E adjacent to the boundary surface 113E.

FIGS. 11 to 19 are diagrams illustrating a process of manufacturing a semiconductor device according to an example embodiment.

Figure 11:
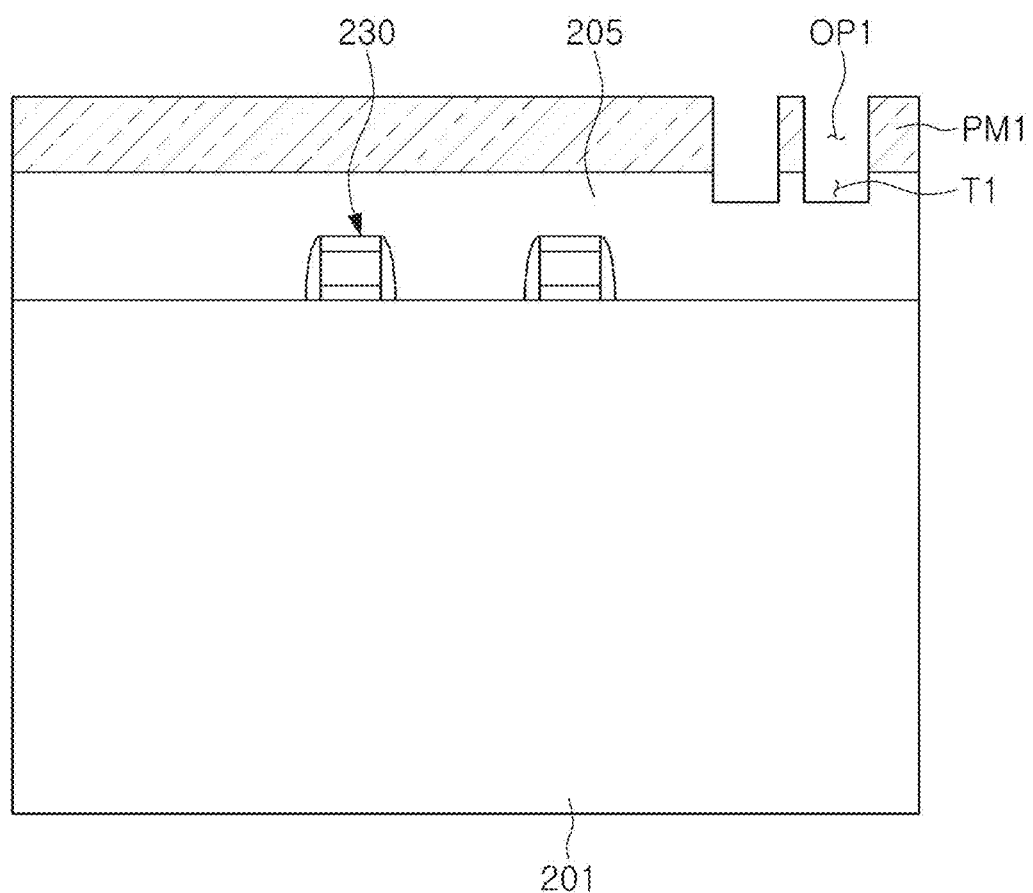
FIGS. 11 to 19 are diagrams illustrating a process of manufacturing a semiconductor device according to an example embodiment of the present inventive concepts.

Referring to FIG. 11, a plurality of semiconductor structures 230 may be disposed on a semiconductor substrate 201, and an interlayer insulating layer 205 covering the semiconductor structures 230 may be disposed on one surface of the semiconductor substrate 201. In the description below, a surface on which the interlayer insulating layer 205 is disposed may be defined as an upper surface of the semiconductor substrate 201.

A first mask layer PM1 may be disposed on an upper surface of the interlayer insulating layer 205. As an example, the first mask layer PM1 may be configured as a hard mask layer and may be a photo-mask. First openings OP1 may be formed in the first mask layer PM1 by selectively removing at least portions of the first mask layer PM1. As an example, the first openings OP1 may be formed in a region in which the plurality of semiconductor structures 230 are not disposed.

When the first openings OP1 are formed, a portion of the interlayer insulating layer 205 exposed in the first openings OP1 may be removed. Referring to FIG. 11, the formation of the first openings OP1 may remove only a portion of the interlayer insulating layer 205 exposed in the first openings OP1, and accordingly, may not expose the upper surface of the semiconductor substrate 201. By removing a portion of the interlayer insulating layer 205 from the first openings OP1, first trenches T1 corresponding to the first openings OP1 may be formed in the interlayer insulating layer 205. When the first trenches T1 are formed, the first mask layer PM1 may be removed from the interlayer insulating layer 205.

Figure 12:
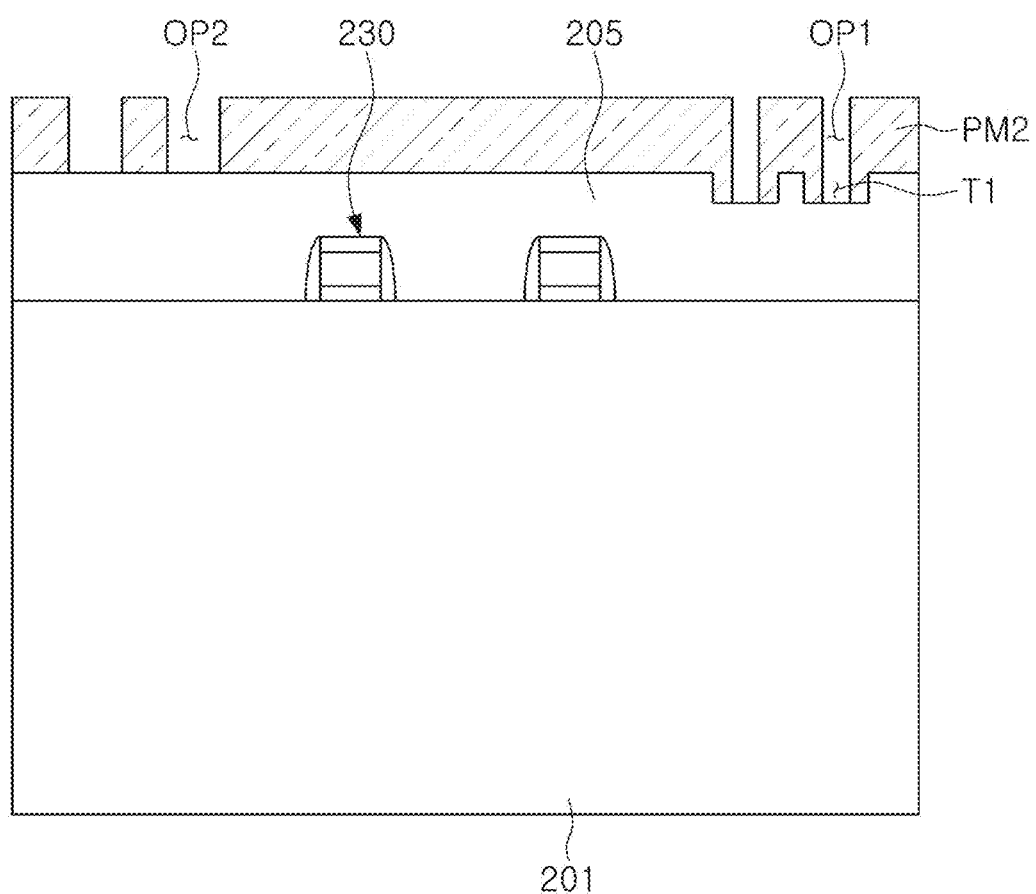

Referring to FIG. 12, a second mask layer PM2 may be disposed on an upper surface of the interlayer insulating layer 205. The second mask layer PM2 may be a photomask. The second mask layer PM2 may include the first openings OP1 formed on the first trenches T1, and second openings OP2 formed separately from the first openings OP1. The second openings OP2 may be formed in a region in which the plurality of semiconductor structures 230 are not disposed, similarly to the first openings OP1.

Each of the first openings OP1 included in the second mask layer PM2 may have a width less than a width of each of the first openings OP1 included in the first mask layer PM1. Accordingly, as illustrated in FIG. 12, portions of the first trenches T1 may be filled with the second mask layer PM2, and a width of each of the first trenches T1 may be decreased by the second mask layer PM2. In the second mask layer PM2, a width of each of the second openings OP2 may be greater than a width of each of the first openings OP1.

Figure 13:
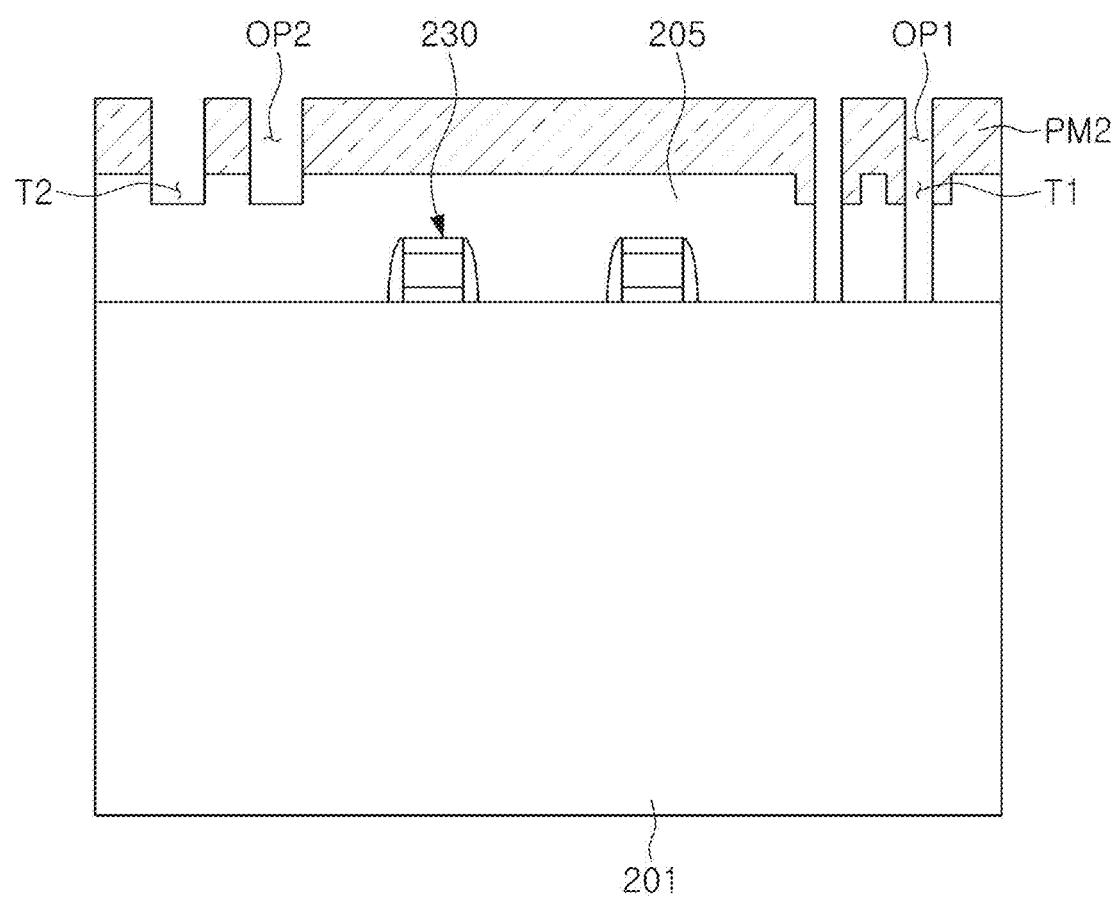

Referring to FIG. 13, an etching process may be performed on the interlayer insulating layer 205 exposed in the first openings OP1 and the second openings OP2. By performing the etching process, the depth of each of the first trenches T1 corresponding to the first openings OP1 may be extended, and second trenches T2 may be formed as a portion of the interlayer insulating layer 205 exposed in the second openings OP2 is removed.

A depth of each of the first trenches T1 may extend to a level at which the semiconductor substrate 201 may be exposed. Accordingly, the interlayer insulating layer 205 may be entirely removed through the first openings OP1, and the semiconductor substrate 201 may be exposed in the first trenches T1. In the second openings OP2, only a portion of the interlayer insulating layer 205 may be removed, and accordingly, a depth of each of the second trenches T2 may be formed to only a portion of the interlayer insulating layer 205. Accordingly, in the second trenches T2, the semiconductor substrate 201 may not be exposed.

Figure 14:
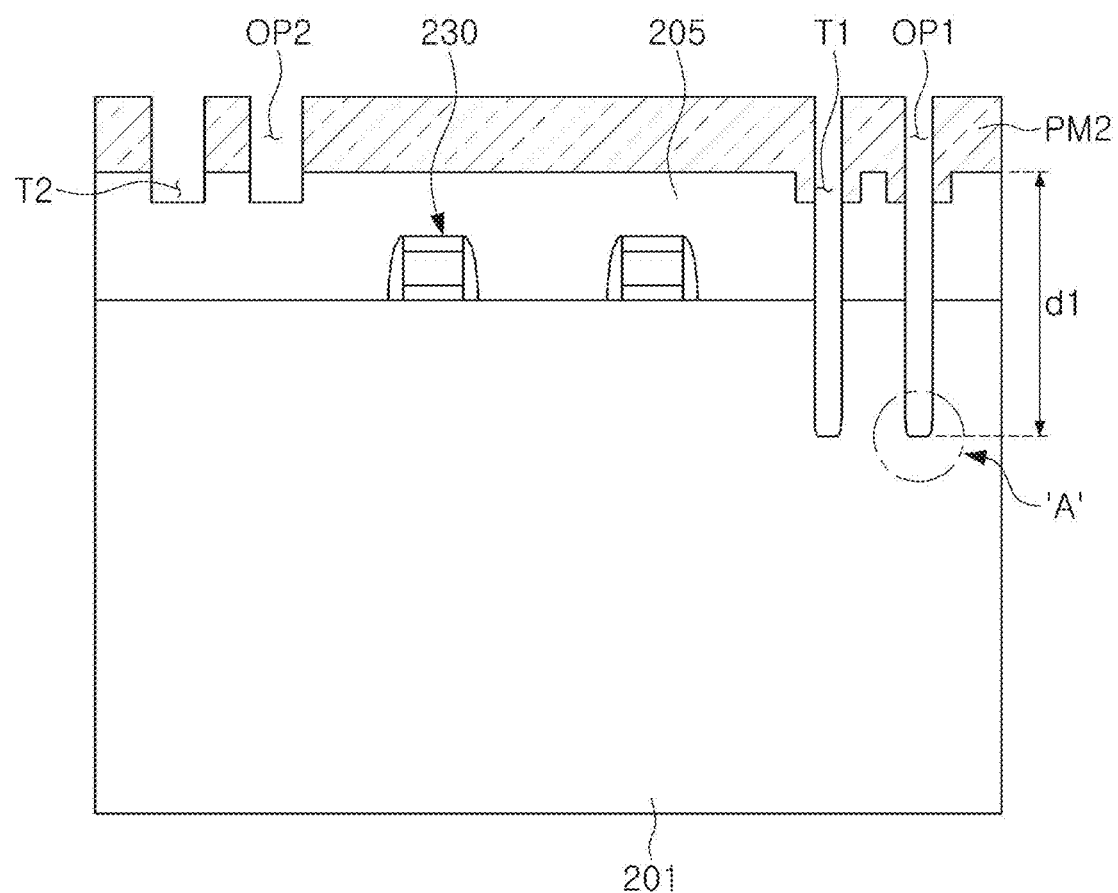

Referring to FIG. 14, the semiconductor substrate 201 may be partially removed by additionally etching the first trenches T1. Accordingly, as illustrated in FIG. 14, a first depth d1 of each of the first trenches T1 may increase to a depth at which the semiconductor substrate 201 may be removed. Under certain process conditions, the semiconductor substrate 201 may have a relatively high etching selectivity with respect to the interlayer insulating layer 205. Accordingly, by selecting the appropriate process conditions, while the semiconductor substrate 201 is removed from the first trenches T1, the interlayer insulating layer 205 exposed from the second openings OP2 may not be etched.

Figure 15:
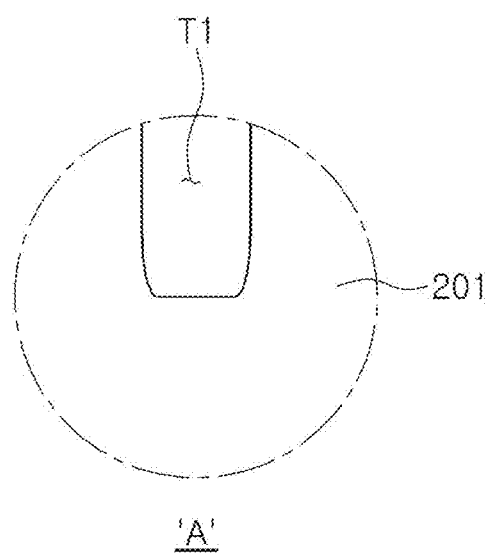

FIG. 15 is an enlarged diagram illustrating region A illustrated in FIG. 14. Referring to FIG. 15, a width of each of the first trenches T1 may have a width decreasing towards a bottom surface. Accordingly, in a region adjacent to a bottom surface of each of the first trenches T1, a cross-sectional surface of each of the first trenches T1 may appear to have a curved shape as illustrated in FIG. 15.

Figure 16:
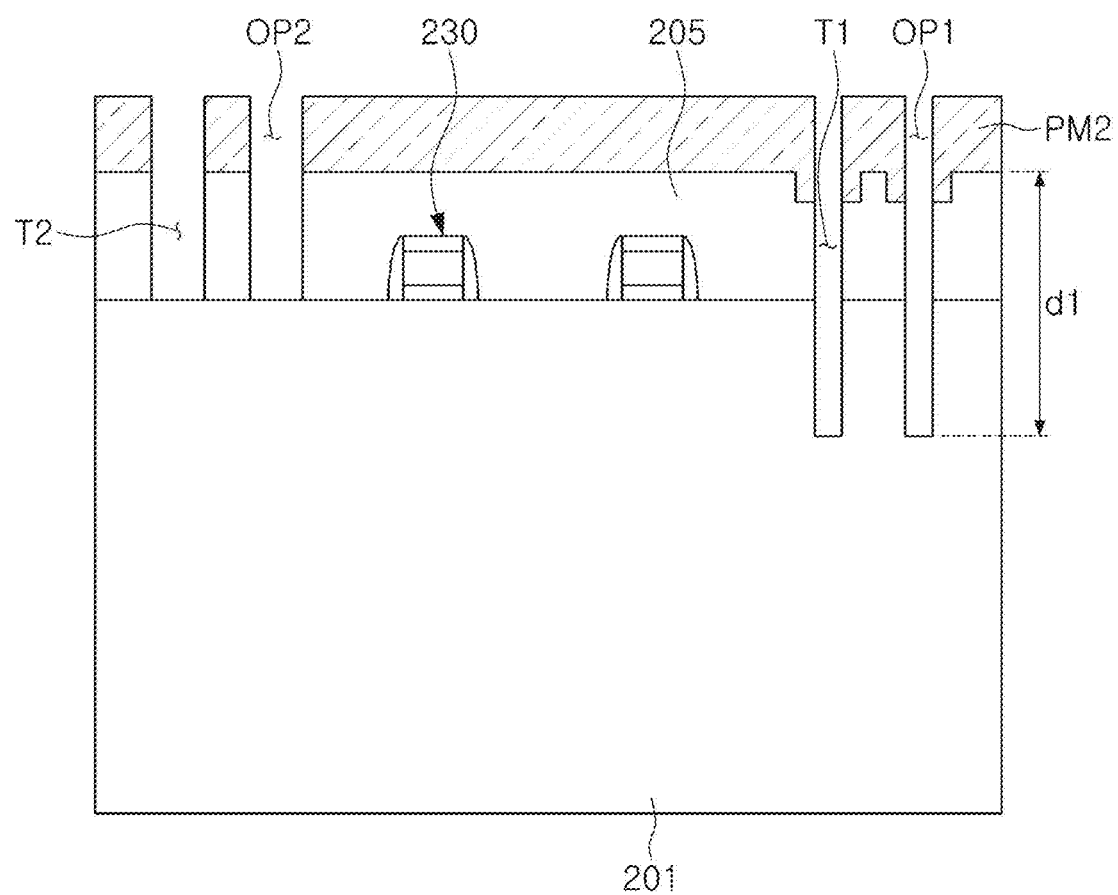

Referring to FIG. 16, a depth of each of the second trenches T2 may extend by additionally etching the interlayer insulating layer 205 in the second openings OP2. The interlayer insulating layer 205 in the second openings OP2 may be etched until the semiconductor substrate 201 is exposed. As described in the aforementioned example embodiment, under certain process conditions, the interlayer insulating layer 205 may have relatively high etching selectivity with respect to the semiconductor substrate 201. Accordingly, while the interlayer insulating layer 205 is removed from the second openings OP2 by an etching process, the semiconductor substrate 201 exposed by the first openings OP1 and the first trenches T1 may not be etched.

When the semiconductor substrate 201 is exposed in the second trenches T2, the second mask layer PM2 may be removed. Also, an etching process for removing the semiconductor substrate 201 exposed in the first trenches T1 and the second trenches T2 may be performed. In the example embodiment illustrated in FIG. 17, a portion of the second mask layer PM2 may remain in a region adjacent to an upper portion of the first trench T1, but an example embodiment thereof is not limited thereto. The second mask layer PM2 may also be entirely removed.

Figure 17:
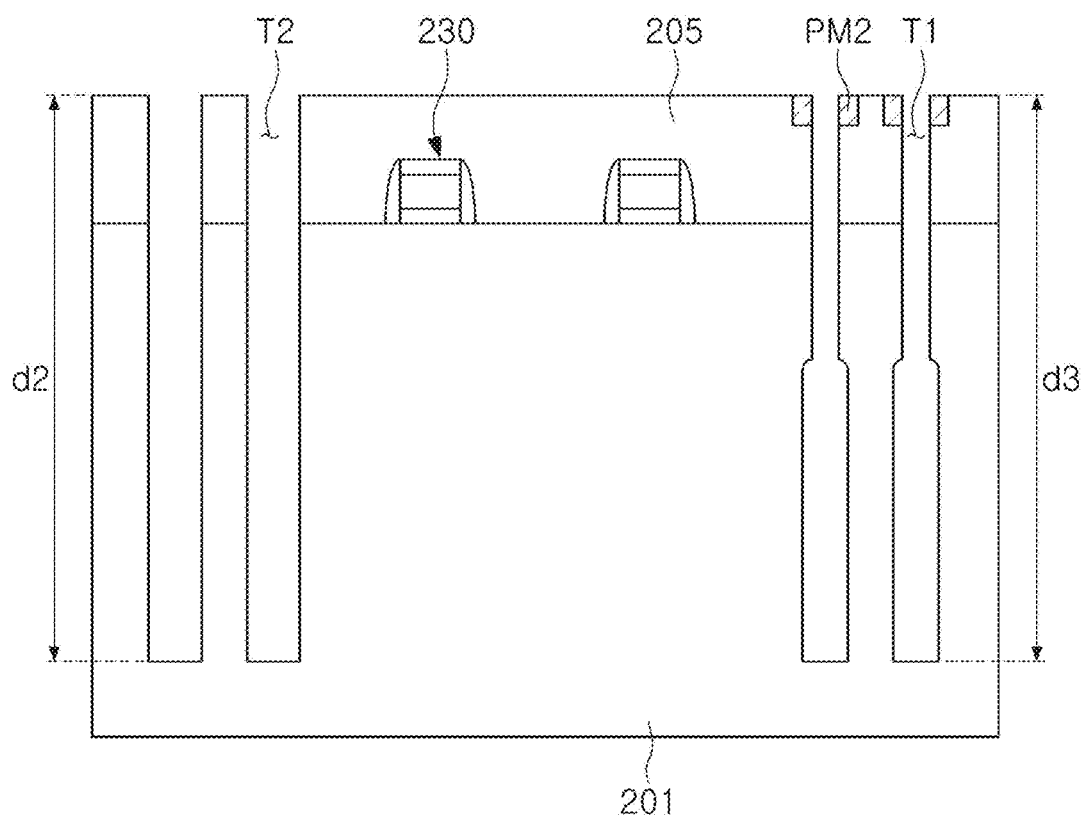

Referring to FIG. 17, the semiconductor substrate 201 may be removed in the first trenches T1 and the second trenches T2. Accordingly, a depth of each of the first trenches T1 may increase from the first depth d1 to a third depth d3, and each of the second trenches T2 may have a second depth d2. As an example, the second depth d2 and the third depth d3 may be less than a thickness of the semiconductor substrate 201. Accordingly, the first trenches T1 and the second trenches T2 may not completely penetrate the semiconductor substrate 201.

Referring to FIG. 17, by performing an etching process for extending the depth of the first trenches T1 and the second trenches T2, each of the first trenches T1 may be divided into an upper region having a relatively small width and a lower region having a relatively great width. As in the aforementioned example embodiment described with reference to FIG. 15, before performing an etching process described with reference to FIG. 17, a point of a cross-sectional surface of each of the first trenches T1 at which a side surface meets a bottom surface of the first trenches T1 may have a curved shape. Accordingly, when the etching process is performed, a recess portion may be formed between an upper region and a lower region of each of the first trenches T1 in the example embodiments.

A plurality of embossed structures may be formed on side surfaces of a lower region of each of the first trenches T1. That is because the etching processes for forming an upper region and a lower region of each of the first trenches T1, respectively, may be performed separately. A size of each of the embossed structures and/or the number of the embossed structures, formed on side surfaces of the lower region, may increase towards an upper region of each of the first trenches T1.

Figure 18:
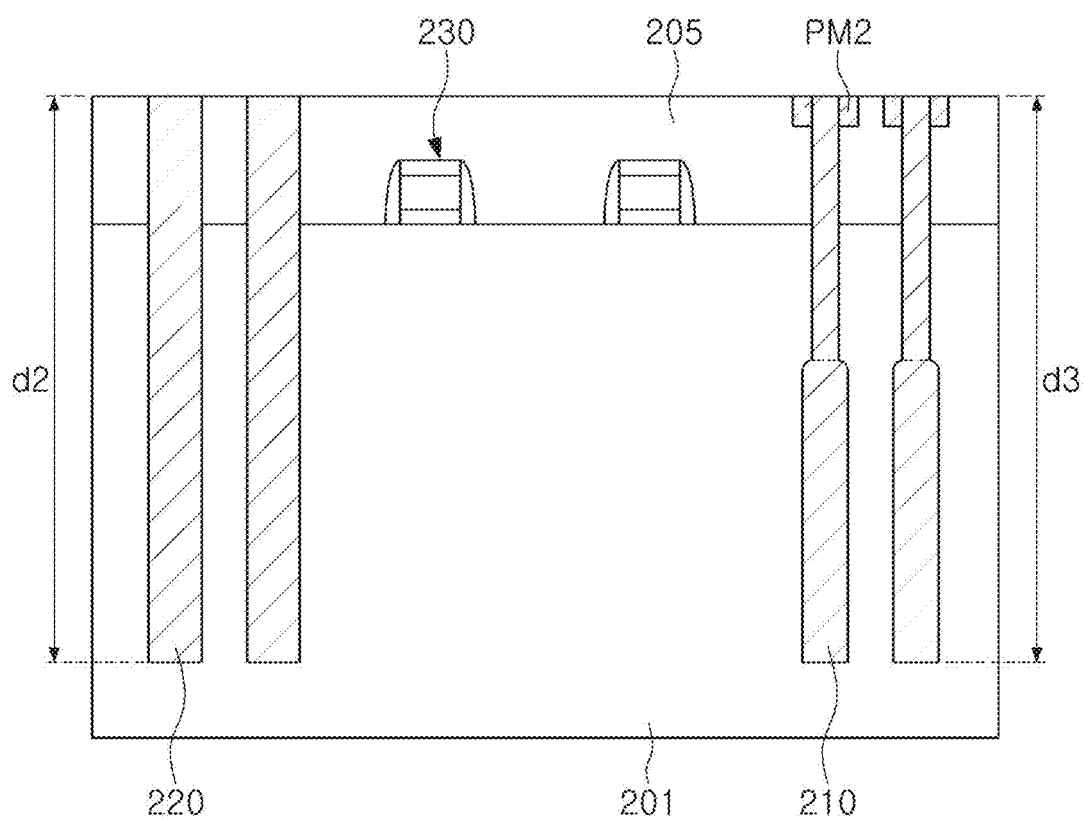

Referring to FIG. 18, first via structures 210 and second via structures 220 may be formed by filling the first trenches T1 and the second trenches T2 with a conductive material. The first via structures 210 and the second via structures 220 may be formed of a material such as a metal, a metal compound, or the like, and shapes of the first via structures 210 and the second via structures 220 may correspond to shapes of the first trenches T1 and the second trenches T2, respectively.

Figure 19:
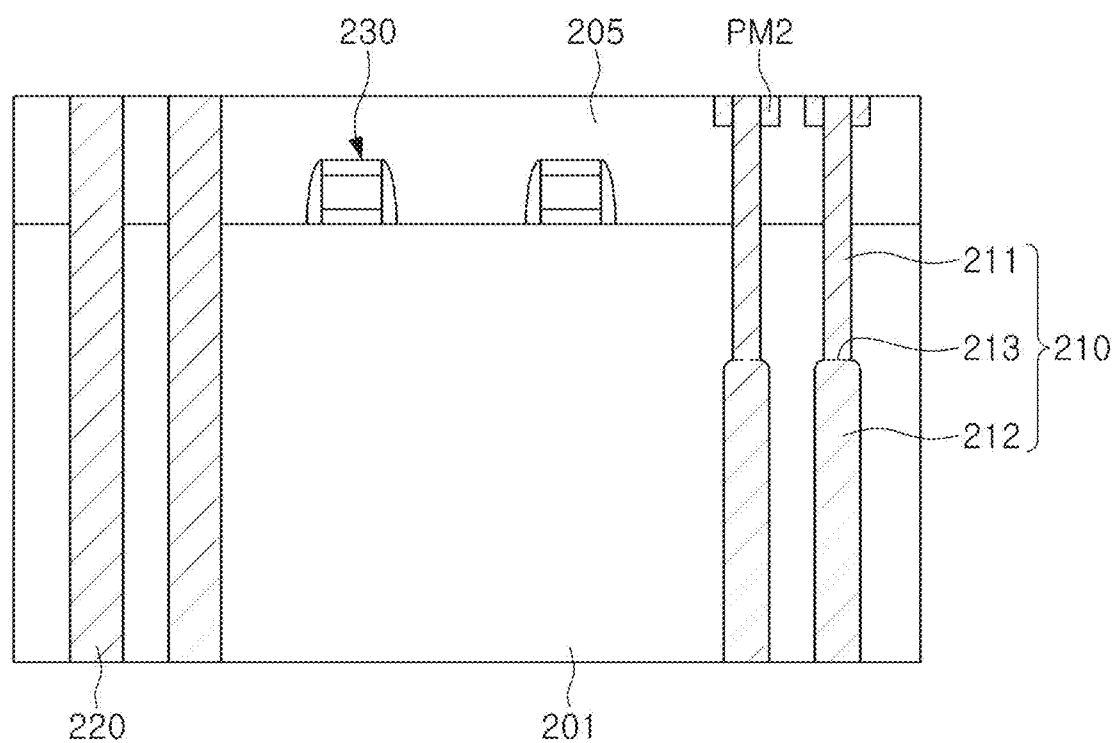

Referring to FIG. 19, a grinding process may be applied to the semiconductor substrate 201 to expose the first via structures 210 and the second via structures 220. As an example, the grinding process may be a chemical-mechanical polishing (CMP) process. The grinding process may be performed from a lower surface of the semiconductor substrate 201. The grinding process may be performed until the first via structures 210 and the second via structures 220 are completely exposed. Accordingly, each of the first via structures 210 may have a height the same as or less than a third depth d3, and each of the second via structures 220 may have a height the same as or less than a second depth d2.

When the height of the first via structures 210 is different from the height of the second via structures 220, the point in time at which the first via structures 210 are exposed by the grinding process performed from a lower surface of the semiconductor substrate 201 may be different from the point in time at which the second via structures 220 are exposed. Additionally, a via structure having a longer height among the first via structures 210 and the second via structures 220 may be exposed earlier than the others. As an example, among the first via structures 210 and the second via structures 220, a via structure having a relatively greater width may be exposed earlier than the others.

As the grinding process may need to be performed until all of the first via structures 210 and the second via structures 220 are exposed, a via structure exposed earlier than the others may be bent or broken due to stress produced by the grinding process. By reducing the difference in length between the first via structures 210 and the second via structures 220, the via structures 210 and 220 may be prevented from being bent or broken during the grinding process.

The greater the difference in width between the first via structures 210 and the second via structures 220, the more the difference in length between the first via structures 210 and the second via structures 220 may increase. As an example, when each of the first via structures 210 has a constant width without a significant change in a length direction as the width of the second via structures 220, the difference in length between the first via structures 210 and the second via structures 220 may increase.

In an example embodiment, each of the first via structures 210 may be divided into a first region 211 and a second region 212 connected through a boundary surface 213. The first region 211 may extend from an upper surface of the interlayer insulating layer 205, and the second region 212 may extend from a lower surface of the semiconductor substrate 201. A width of the first region 211 exposed on the upper surface of the interlayer insulating layer 205 may be less than a width of the second region 212 exposed on the lower surface of the semiconductor substrate 201.

Among processes for forming the first via structures 210, an etching process for removing the semiconductor substrate 201 may be divided into two processes. As described in the aforementioned example embodiments with reference to FIGS. 11 to 18, the first trenches T1 may be formed by etching the semiconductor substrate 201 to form the first via structures 210. The etching process for forming the first trenches T1 may include a first etching process for removing a region corresponding to the first region 211 from the semiconductor substrate 201 and a second etching process for removing a region corresponding to the second region 212 from the semiconductor substrate 201.

Referring to FIG. 17 illustrating the second etching process, both the region corresponding to the second region 212 and the region corresponding to the second via structures 220 may be removed from the semiconductor substrate 201. In other words, both the region corresponding to the second region 212 of each of the first via structures 210 and the regions corresponding to the second via structures 220 may be removed from the semiconductor substrate 201 under the same etching conditions. Accordingly, the difference between the depth d3 of each of the first trenches T1 corresponding to the first via structures 210 and the depth d2 of each of the second trenches T2 corresponding to the second via structures 220 may be significantly reduced.

Figure 20:
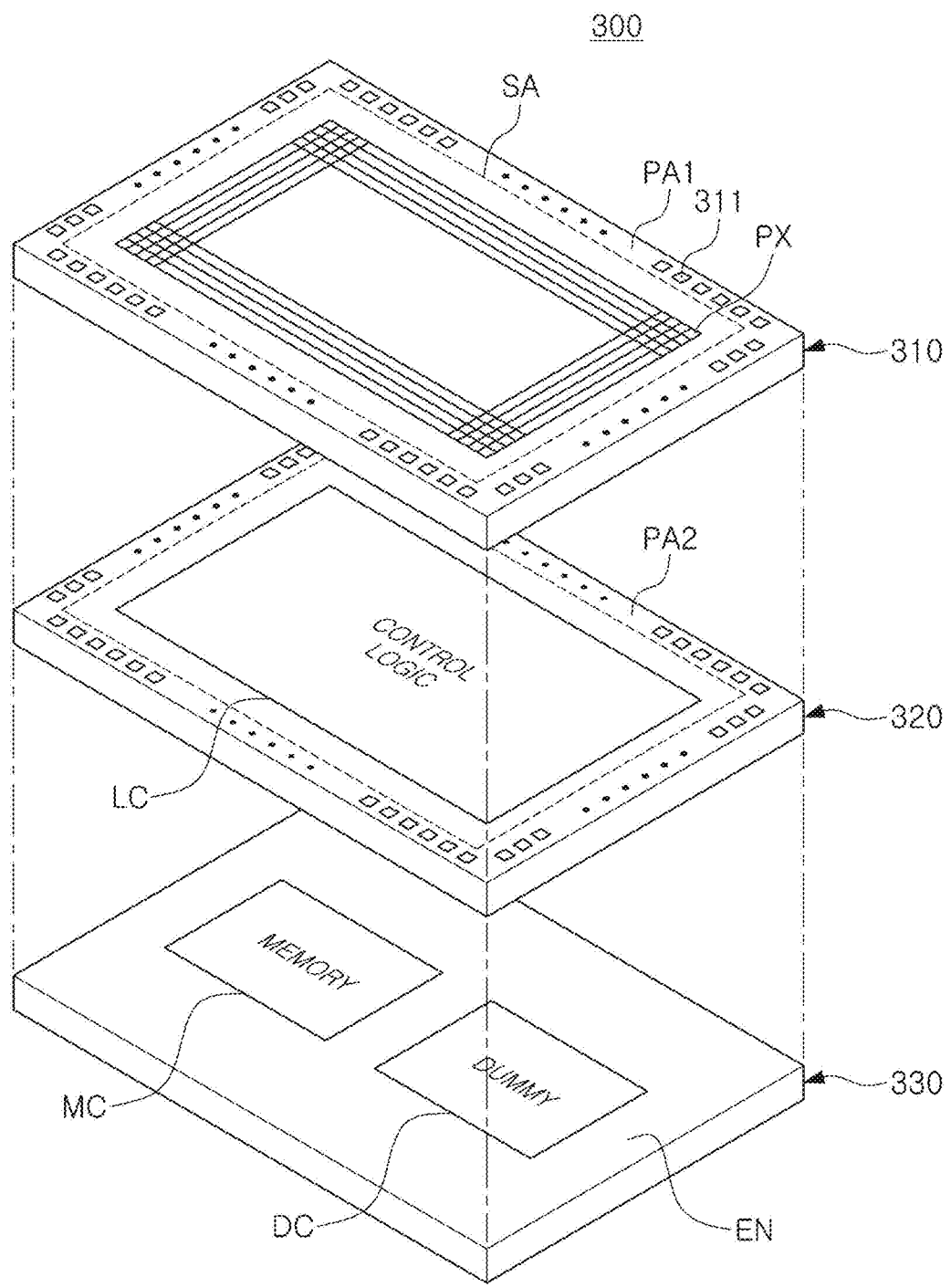
FIG. 20 is a diagram illustrating a semiconductor package according to an example embodiment of the present inventive concepts.

FIG. 20 is a diagram illustrating a semiconductor package according to an example embodiment.

Referring to FIG. 20, a semiconductor package 300 in the example embodiment may provide an image device. The semiconductor package 300 may include a first semiconductor device 310, a second semiconductor device 320, a third semiconductor device 330, and others. The first semiconductor device 310, the second semiconductor device 320, and the third semiconductor device 330 may be stacked in a vertical direction. In an example embodiment, the first semiconductor device 310 and the second semiconductor device 320 may be stacked on a wafer level, and the third semiconductor device 330 may be attached to a lower portion of the second semiconductor device 320 on a chip level.

The first semiconductor device 310 may include a sensing region SA in which a plurality of pixels PX are arranged, and a first pad region PA1 arranged around the sensing region SA. A plurality of via structures 311 may be disposed in the first pad region PA1. The plurality of via structures 311 may penetrate a semiconductor substrate included in the first semiconductor device 310, and may be connected to pads arranged in a second pad region PA2 of the second semiconductor device 320.

Each of the plurality of pixels PX included in the first semiconductor device 310 may include a photodiode receiving light and generating an electric charge, a pixel circuit for processing an electric charge generated by the photodiode, and others. The pixel circuit may include a plurality of transistors for outputting a voltage corresponding to an electric charge generated by the photodiode.

A control logic LC of the second semiconductor device 320 may provide circuits for driving the plurality of pixels PX arranged in the first semiconductor device 310, such as a clock driver, a readout circuit, a calculation circuit, a timing controller, an image processor, a power circuit, and the like. The plurality of circuits included in the control logic LC may be connected to a pixel circuit through the first and second pad regions PA1 and PA2. The control logic LC may obtain a reset voltage and a pixel voltage from the plurality of pixels PX and may generate a pixel signal.

As an example, the plurality of pixels PX disposed in the first semiconductor device 310 may be electrically connected to the control logic LC disposed in the second semiconductor device 320 by the via structures 311 and the pads. The control logic LC may transmit a data signal and a power signal to the plurality of pixels PX and may receive a data signal and a power signal from the plurality of pixels PX, and the via structures 311 may include first via structures for transferring the data signal, and second via structures for transferring the power signal. As an example, each of the first via structures may have a width less than a width of each of the second via structures.

In the example embodiment, each of the first via structures may have a first region and a second region having different widths as described in the aforementioned example embodiments. The second region may have a width greater than a width of the first region, and may be closer to the second semiconductor device 320 than the first region. Accordingly, by significantly reducing a difference in length between the first via structures and the second via structures, damages to the via structures 311 produced in the grinding process for exposing the first via structures and the second via structures, or other processes, may be reduced.

Figure 21:
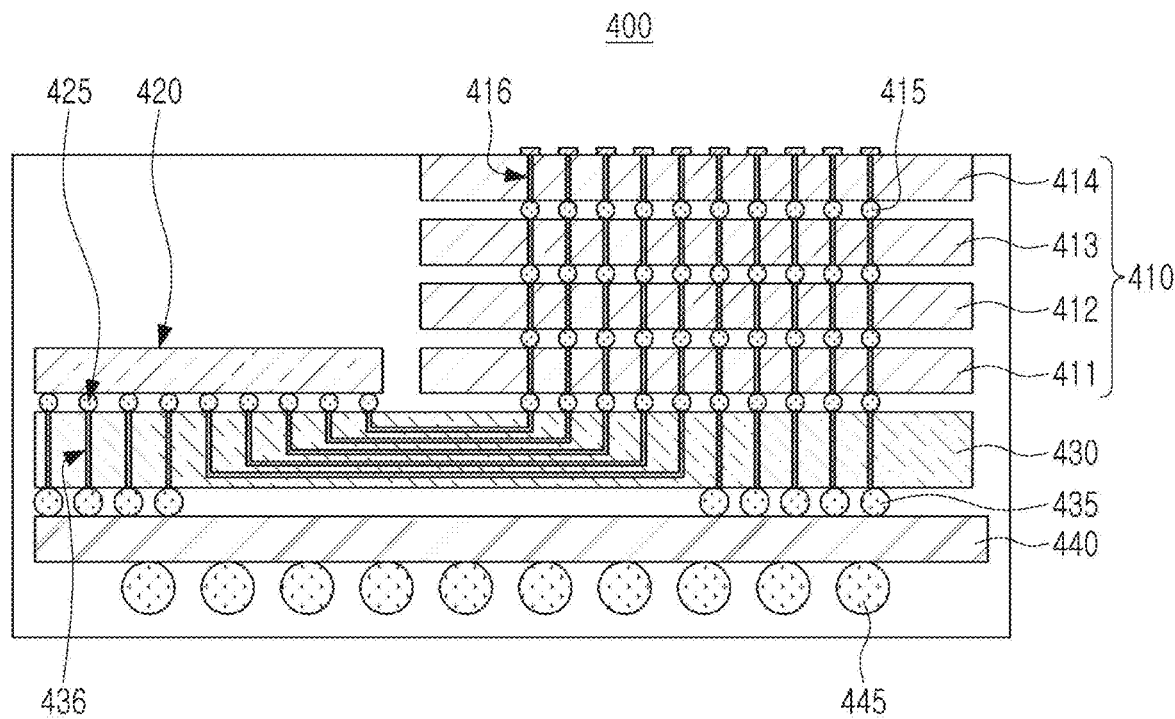
FIGS. 21 and 22 are diagrams illustrating a semiconductor package according to an example embodiment of the present inventive concepts.
Figure 22:
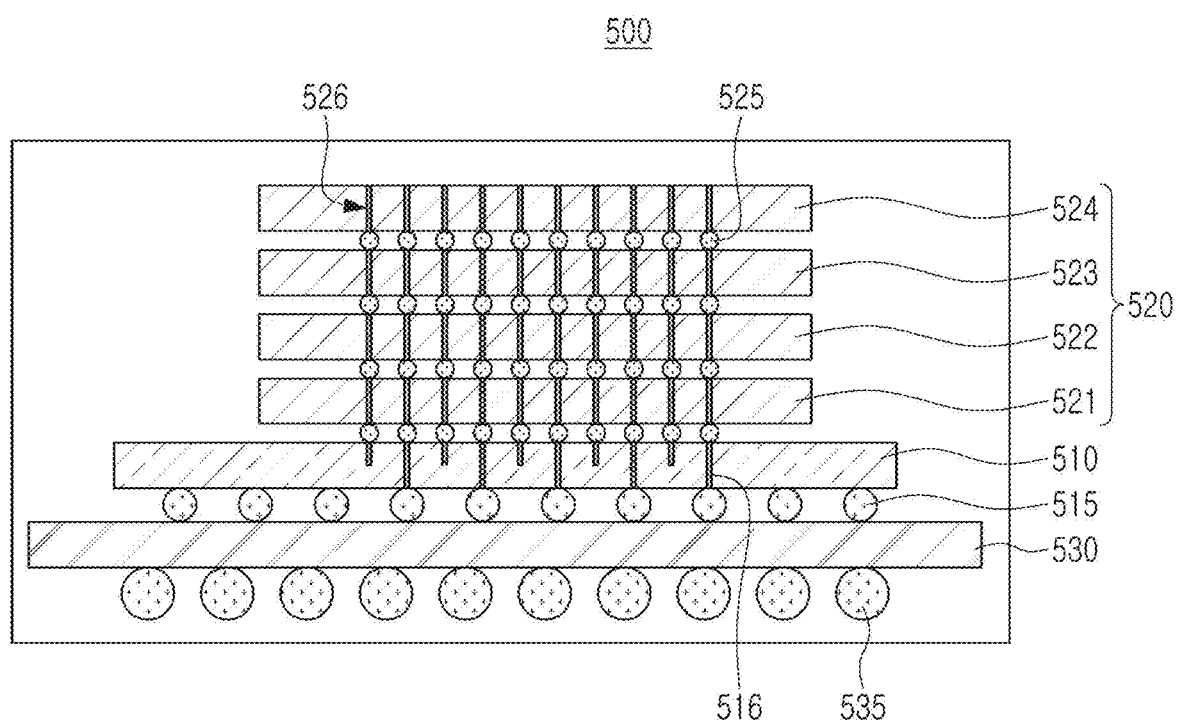

FIGS. 21 and 22 are diagrams illustrating a semiconductor package according to an example embodiment.

Referring to FIGS. 21 and 22, semiconductor packages 400 and 500 in the example embodiment may be implemented as memory packages for storing data. The semiconductor packages 400 and 500 in the example embodiments illustrated in FIGS. 21 and 22 may be implemented as high bandwidth memory (HBM) devices including a plurality of vertically stacked memory dies.

Referring to FIG. 21, the semiconductor package 400 may include a plurality vertically stacked memory dies 411 to 414 (410), a memory controller 420 controlling the memory dies 410, an interposer substrate 430, a package substrate 440, and others. The number of vertically stacked memory dies 410 may vary if desired, and each of the memory dies 410 may include microbumps 415 and via structures 416 for transmitting and receiving a data signal and a power signal. The memory dies 410 may be mounted on the interposer substrate 430.

The memory controller 420 may control the memory dies 410. For example, the memory controller 420 may store data in the memory dies 410 or may read out data stored in the memory dies 410. The memory controller 420 may be mounted on the interposer substrate 430, and may be connected to an internal wiring 436 of the interposer substrate 430 through a microbump 425. Thus, the memory controller 420 may be at the same level as a memory die 411 mounted on the interposer substrate 430.

An interposer substrate 430 may connect the memory dies 410, the memory controller 420, and the package substrate 440. The interposer substrate 430 may be connected to the package substrate 440 through a bump 435, and may include internal wiring 436 connecting the memory dies 410, the memory controller 420, and the package substrate 440.

The package substrate 440 may include a bump 445, and may transfer and received a data signal, a power signal, and the like, to and from, for example, an external entity of the semiconductor package 400, the memory controller 420 and/or memory dies 410 through the interposer substrate 430. The bump 445 disposed on a lower surface of the package substrate 440 may have a size greater than a size of each of the other microbumps 415, 425, and 435 included in the semiconductor package 400.

The memory dies 410 may transmit and receive a data signal and a power signal from the memory controller 420, the interposer substrate 430, or the package substrate 440 through the via structures 416. The via structures 416 may include first via structures provided as transfer paths of a data signal, and second via structures provided as transfer paths of a power signal.

As an example, the first via structures and the second via structures may have different shapes, different sizes, and other different characteristics. Each of the first via structures may be smaller than each of the second via structures are, and as in the aforementioned example embodiments described with reference to FIGS. 1 to 19, each of the first via structures may include a first region and a second region having different widths. Accordingly, by significantly reducing the difference in length appearing in the process of forming the via structures 416, the bending or breakage of the via structures 416 occurring in the grinding process for exposing the via structures 416 may be significantly reduced.

Referring to FIG. 22, the semiconductor package 500 may include a memory controller 510, a plurality of memory dies 521 to 524 (520) stacked on the memory controller 510, a package substrate 530, and others. The number of the plurality of memory dies 520 may be varied if desired, and each of the memory dies 520 may include microbumps 525 and via structures 526 for transmitting and receiving data and power signals.

The memory controller 510 may be directly mounted on the package substrate 530 by a bump 515. The memory controller 510 may transmit and received a data signal and a power signal from an external entity through the package substrate 530, and may control operations of the memory dies 520. The memory controller 510 may include via structures 516 for securing the electrical connection with the memory dies 520 and the package substrate 530. At least portions of the via structures 516 may penetrate the memory controller 510.

The via structures 516 and 526 arranged in the memory controller 510 and the memory dies 520 may include first via structures providing transfer paths for the data signals and second via structures providing transfer paths for the power signals. As in the aforementioned example embodiment described with reference to FIG. 21, each of the first via structures may have a shape and/or a size different from the shape and/or size of each of the second via structures. The first via structures and the second via structures may be configured to transfer different signals, for example the first via structures may be configured to transfer data signals and the second via structures may be configured to transfer power signals. As an example, side surfaces of the first via structures may have a profile different from a profile of side surfaces of the second via structures. Each of the first via structures may include a first region and a second region having different widths, and a recess portion in which a minimum width appears may be formed at or near a boundary surface between the first region and the second region. Side surfaces of the second region may have curvatures formed by embossed structures in a region adjacent to the boundary surface between the first region and the second region.

Figure 23:
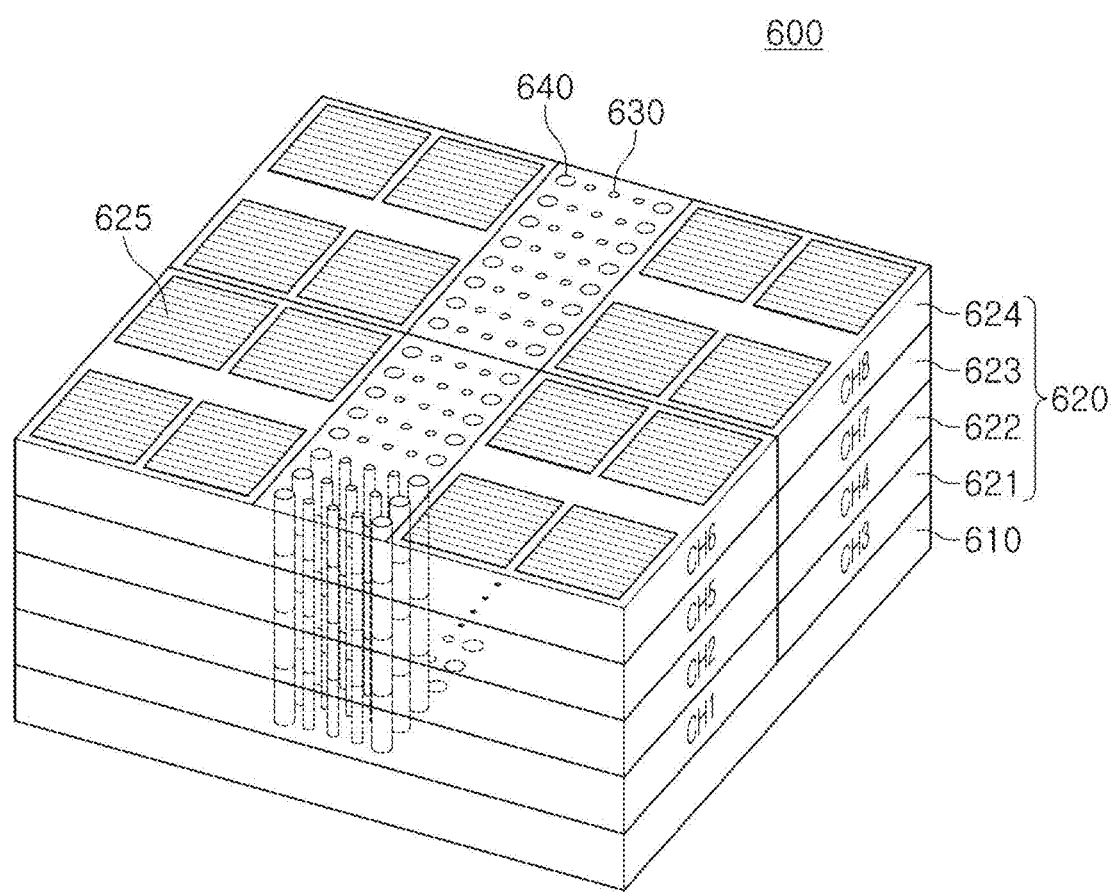
FIGS. 23 and 24 are diagrams illustrating a semiconductor package according to an example embodiment of the present inventive concepts.
Figure 24:
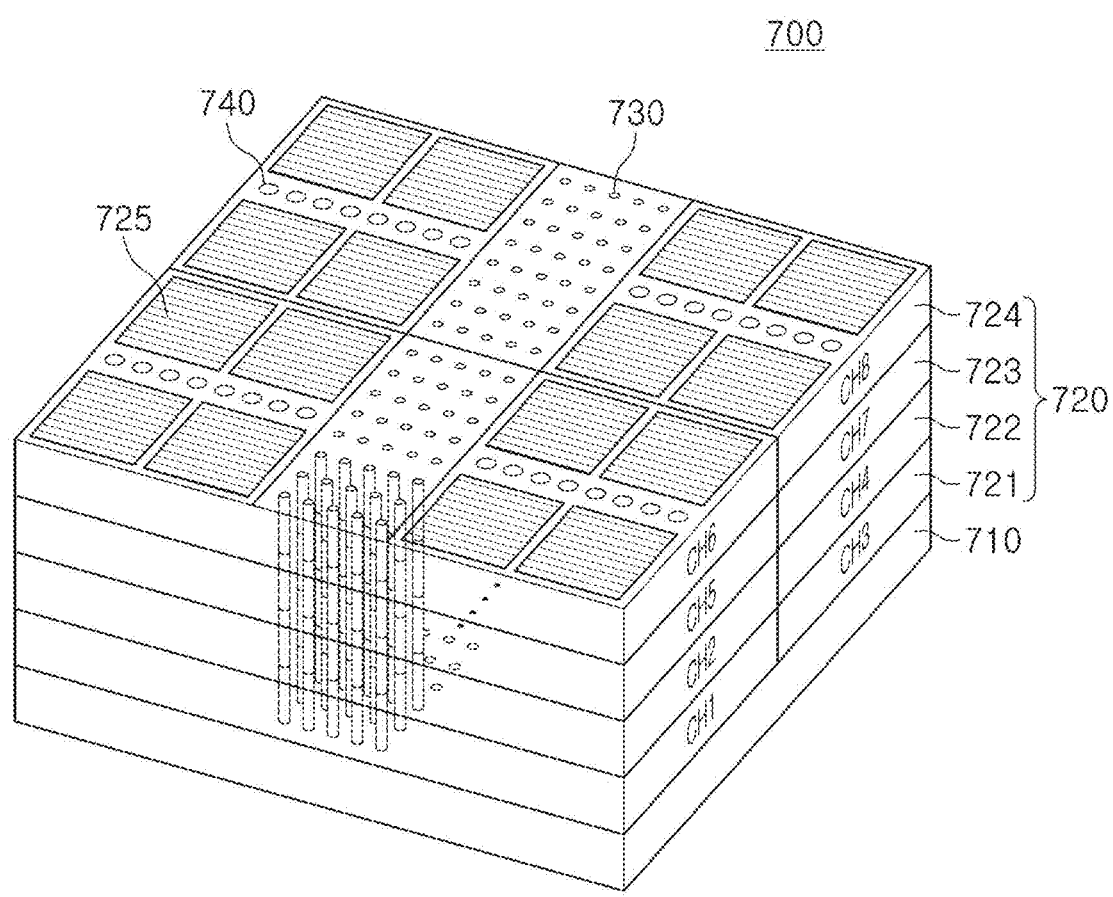

FIGS. 23 and 24 are diagrams illustrating a semiconductor package according to an example embodiment.

In the example embodiment illustrated in FIGS. 23 and 24, semiconductor packages 600 and 700 may be implemented as high bandwidth memory devices. In the example embodiments illustrated in FIGS. 23 and 24, the semiconductor packages 600 and 700 may include two or more channels each having an independent interface, thereby having an increased bandwidth. Referring to FIG. 23, the semiconductor packages 600 may include a plurality of memory dies 621 to 624 (620), and a memory controller 610 controlling the memory dies 620 may be stacked with the memory dies 620. The number of the memory dies 620 may be varied in example embodiments.

Each of the memory dies 620 may include a plurality of memory banks 625, and may include one or more channels. In the example embodiment illustrated in FIG. 23, each of the memory dies 620 may include two channels, and accordingly, the semiconductor packages 600 may include eight channels CH1 to CH8.

The memory controller 610 may store data in the memory dies 620 or may read out data stored in the memory dies 620 on the basis of a control command, address information, and the like, received from an external entity. The memory controller 610 may be connected to the memory dies 620 through a plurality of via structures 630 and 640. The number of the via structures 630 and 640 may be varied in accordance with the number of the channels CH1 to CH8 and a bandwidth of each of the channels CH1 to CH8. As an example, when a bandwidth of each of the channels CH1 to CH8 is 128 bits, the via structures 630 and 640 may be configured to transmit 1024-bit data.

The via structures 630 and 640 may include first via structures 630 and second via structures 640 having different widths. Each of the first via structures 630 may have a width relatively smaller than a width of each of the second via structures 640. As an example, the first via structures 630 may be provided as transmission paths of a data signal, and the second via structures 640 may be provided as transmission paths of a power signal. In the example embodiment illustrated in FIG. 23, the first via structures 630 may be disposed between the second via structures 640, but an example embodiment thereof is not limited thereto. An arrangement form of the via structures 630 and 640 may be varied.

Each of the first via structures 630 in each of the memory dies 620 may be divided into a first region and a second region in a length direction. The first region may have a width smaller than a width of the second region. As in the aforementioned example embodiments described with reference to FIGS. 1 to 19, as the first via structures 630 are configured to include the first region and the second region, a difference in length appearing in the process of forming the via structures 630 and 640 may be significantly reduced. Accordingly, warpage and/or breakage of the via structures 630 and 640 occurring in a grinding process of exposing the via structures 630 and 640 may be significantly reduced.

Referring to FIG. 24, the semiconductor package 700 may include a plurality of memory dies 721 to 724 (720), and a memory controller 710 controlling the memory dies 720 may be stacked with the memory dies 720. An operation of the semiconductor package 700 in the example embodiment illustrated in FIG. 24 may be similar to an operation of the semiconductor package 600 in the example embodiment illustrated in FIG. 23.

In the example embodiment illustrated in FIG. 24, however, second via structures 740 provided as transfer paths for a power signal may be separated from the first via structures 730 provided as transfer paths for a data signal. Referring to FIG. 24, the second via structures 740 may be disposed between memory banks 725 corresponding to channels CH1 to CH8, respectively. The shape and size of each of the first via structures 730 and the second via structures 740 may be understood from the aforementioned example embodiment described with reference to FIGS. 1 to 19.

According to the aforementioned example embodiments, the semiconductor device may include a first via structure and a second via structure, and the first via structure may include a first region and a second region having different widths. A width of the first region of the first via structure on a first surface of the semiconductor device may be less than a width of the second via structure. By configuring the first via structure to include the first region and the second region, the difference in length between the first via structure and the second via structure may be reduced. As a result, the stress and strain on the via structures during the grinding process may be reduced, thus also reducing or preventing the breaking of the via structures. By preventing the breakage of the via structures, production of the semiconductor devices may have improved reliability and an improved yield.

While the example embodiments have been shown and described above, it will be apparent to those skilled in the art that modifications and variations could be made without departing from the scope of the present inventive concept as defined by the appended claims.

What is claimed is:

1. A semiconductor device, comprising:
a semiconductor substrate;
at least one semiconductor structure;
an interlayer insulating layer disposed on the semiconductor substrate and the semiconductor structure;
at least one first via structure penetrating the semiconductor substrate and the interlayer insulating layer, the first via structure including a first region having a first width at an upper surface of the interlayer insulating layer and a second region extending from the first region and having a second width at a lower surface of the semiconductor substrate, wherein a side surface of the first region and a side surface of the second region have different profiles at a boundary between the first region and the second region; and
at least one second via structure penetrating the semiconductor substrate and the interlayer insulating layer and having a third width greater than the first width at the upper surface of the interlayer insulating layer.

2. The semiconductor device of claim 1, wherein the first width is less than the second width.

3. The semiconductor device of claim 1, wherein at least a portion of the second region has a width increasing from the boundary.

4. The semiconductor device of claim 1, wherein at least a portion of the first region has a width increasing from the boundary.

5. The semiconductor device of claim 1, wherein the side surface of the second region has a curved shape in a region adjacent to the boundary.

6. The semiconductor device of claim 5, wherein the side surface of the second region has embossed structures.

7. The semiconductor device of claim 1, wherein the at least one first via structure and the at least one second via structure are configured to transfer different signals.

8. The semiconductor device of claim 7, wherein the at least one first via structure is configured to transfer a data signal, and the at least one second via structure transfers is configured to transfer a power signal.

9. The semiconductor device of claim 1, wherein a side surface of the at least one first via structure and a side surface of the at least one second via structure have different profiles.

10. The semiconductor device of claim 1, wherein the boundary is in the semiconductor substrate.

11. The semiconductor device of claim 1, wherein a length of the at least one first via structure is the same as a length of the at least one second via structure.

12. The semiconductor device of claim 1, wherein the third width is less than the second width.

13. The semiconductor device of claim 1, wherein the third width is greater than the second width.

14. A semiconductor package, comprising:
a first semiconductor device; and
a second semiconductor device stacked with the first semiconductor device,
wherein the first semiconductor device includes at least one first via structure and at least one second via structure penetrating the first semiconductor device, and wherein the at least one first via structure includes a first region and a second region, the first region having a first width on an upper surface of the first semiconductor device, the second region having a second width on a lower surface of the first semiconductor device, and the second width being different from the first width, and a width of a boundary surface between the first region and the second region is less than the first width.

15. The semiconductor package of claim 14, wherein the at least one second via structure has a third width greater than the first width.

16. The semiconductor package of claim 14, wherein the first semiconductor device and the second semiconductor device are mounted on a package substrate, and the first semiconductor device includes at least one memory die configured to store data.

17. The semiconductor package of claim 16,
wherein the second semiconductor device includes at least one memory die configured to store data, and
wherein the semiconductor package further comprises a memory controller mounted on the package substrate at a same level as a level of the second semiconductor device and is configured to control the first semiconductor device and the second semiconductor device.

18. The semiconductor package of claim 16, wherein the second semiconductor device includes a memory controller configured to control the first semiconductor device.

19. The semiconductor package of claim 16, wherein the at least one first via structure is in a first area of the first semiconductor device and the at least one first via structure is configured to transfer a data signal, and the at least one second via structure is in a second area of the first semiconductor device, the second area of the first semiconductor device separated from the first region of the first semiconductor device and the at least one second via structure configured to transfer a power signal.

20. A semiconductor package, comprising:

a package substrate;

a plurality of memory dies mounted on the package substrate, the plurality of memory dies including memory cells configured to store data, and the plurality of memory dies stacked in a direction perpendicular to an upper surface of the package substrate;

a first via structure penetrating the plurality of memory dies and configured to provide a transfer path for a data signal; and a second via structure penetrating the plurality of memory dies and configured to provide a transfer path for a power signal, wherein a difference between a width of the first via structure at a lower surface of at least one of the plurality of memory dies and a width of the first via structure at an upper surface of the at least one of the plurality of memory dies is less than a difference between a width of the second via structure at a lower surface of at least one of the plurality of memory dies and a width of the second via structure at an upper surface of the plurality of memory dies, and wherein the width at the upper surface of the first via structure is less than the width at the upper surface of the second via structure.

* * * * *